United States Patent
Dunga et al.

(10) Patent No.: US 10,741,251 B2
(45) Date of Patent: Aug. 11, 2020

(54) NON-VOLATILE MEMORY WITH FAST PARTIAL PAGE OPERATION

(71) Applicant: SanDisk Technologies LLC, Plano, TX (US)

(72) Inventors: Mohan V Dunga, Santa Clara, CA (US); Pitamber Shukla, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 35 days.

(21) Appl. No.: 15/955,156

(22) Filed: Apr. 17, 2018

(65) Prior Publication Data

US 2019/0180822 A1 Jun. 13, 2019

(51) Int. Cl.

| G11C 13/04 | (2006.01) |
|---|---|
| G11C 16/10 | (2006.01) |
| G11C 13/00 | (2006.01) |
| G11C 16/04 | (2006.01) |
| G11C 16/08 | (2006.01) |
| G11C 16/34 | (2006.01) |
| G11C 16/26 | (2006.01) |
| G11C 29/50 | (2006.01) |
| G11C 8/08 | (2006.01) |
| G11C 29/02 | (2006.01) |
| G11C 29/00 | (2006.01) |
| H01L 27/11556 | (2017.01) |
| H01L 27/11582 | (2017.01) |
| H01L 27/24 | (2006.01) |
| G11C 7/10 | (2006.01) |
| G11C 29/42 | (2006.01) |

(Continued)

(52) U.S. Cl.
CPC ............... *G11C 16/10* (2013.01); *G11C 8/08* (2013.01); *G11C 13/0004* (2013.01); *G11C 13/004* (2013.01); *G11C 13/0026* (2013.01); *G11C 13/0028* (2013.01); *G11C 13/0064* (2013.01); *G11C 13/0069* (2013.01); *G11C 16/0483* (2013.01); *G11C 16/08* (2013.01); *G11C 16/26* (2013.01); *G11C 16/3459* (2013.01); *G11C 29/028* (2013.01); *G11C 29/50012* (2013.01); *G11C 7/1015* (2013.01); *G11C 7/18* (2013.01); *G11C 8/14* (2013.01); *G11C 29/42* (2013.01); *G11C 29/838* (2013.01); *G11C 2013/0085* (2013.01); *G11C 2013/0092* (2013.01); *G11C 2029/1202* (2013.01); *G11C 2213/71* (2013.01); *H01L 27/1157* (2013.01); *H01L 27/11556* (2013.01); *H01L 27/11582* (2013.01); *H01L 27/249* (2013.01)

(58) Field of Classification Search
CPC .................................................. G11C 13/004
USPC .......................................................... 365/148
See application file for complete search history.

(56) References Cited

U.S. PATENT DOCUMENTS

| 9,318,210 B1 | 4/2016 | Hart et al. |
| 2015/0058566 A1* | 2/2015 | Yoon .................... G11C 13/004 |
| | | 711/118 |

* cited by examiner

*Primary Examiner* — Jason Lappas
(74) *Attorney, Agent, or Firm* — Vierra Magen Marcus LLP

(57) ABSTRACT

A non-volatile memory system comprises a memory structure and a control circuit connected to the memory structure. The memory structure includes one or more planes of non-volatile memory cells. Each plane is divided into a plurality of partial planes. The control circuit is configured to write to and read from the memory cells by writing a partial page into a particular partial plane and reading the (Continued)

partial page from the particular partial plane using a set of parameters optimized for the particular partial plane.

20 Claims, 19 Drawing Sheets

(51) Int. Cl.
    *G11C 29/12*         (2006.01)
    *G11C 8/14*          (2006.01)
    *G11C 7/18*          (2006.01)
    *H01L 27/1157*     (2017.01)

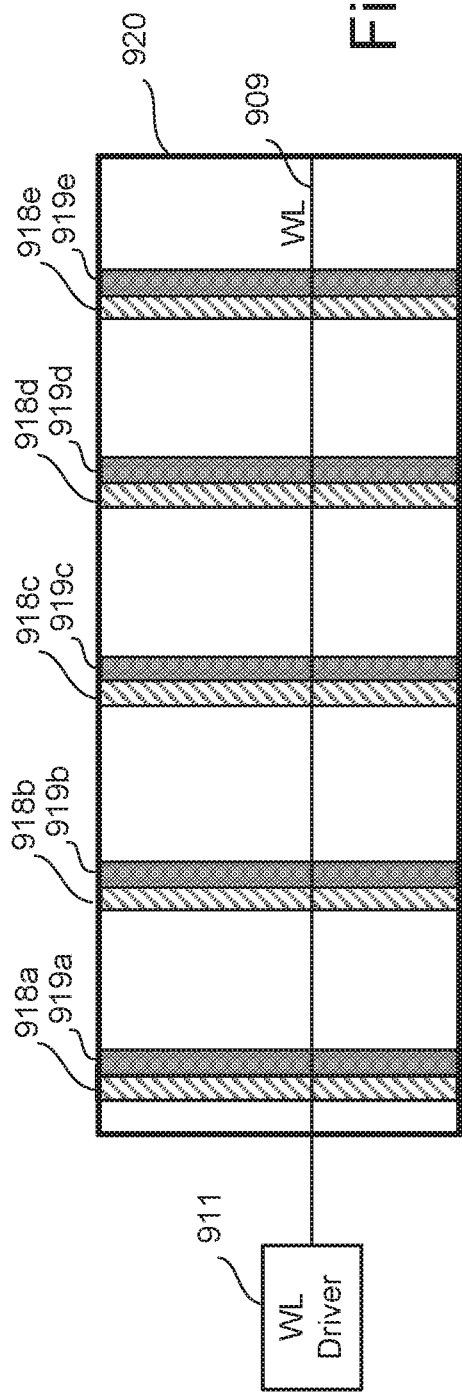
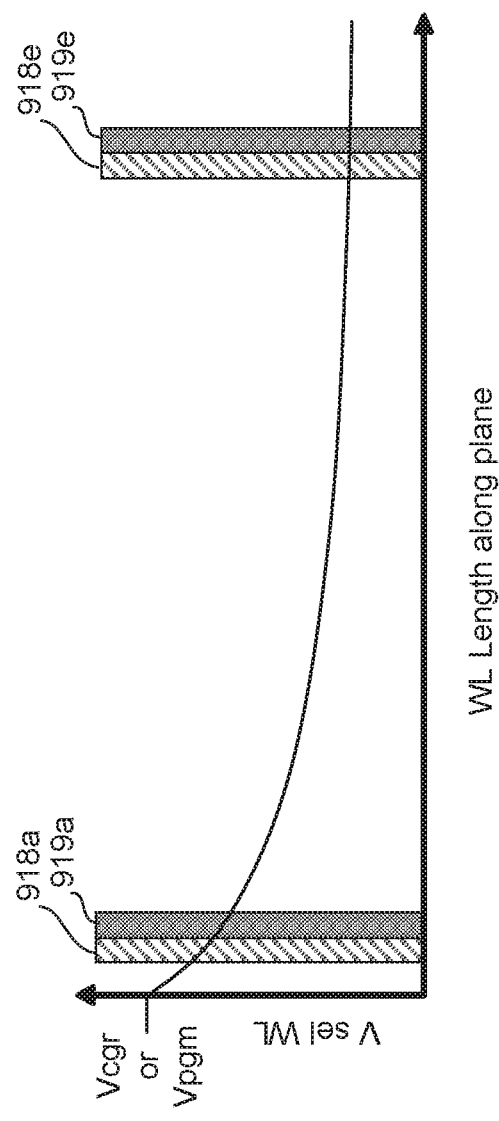
Figure 10A
Figure 10B

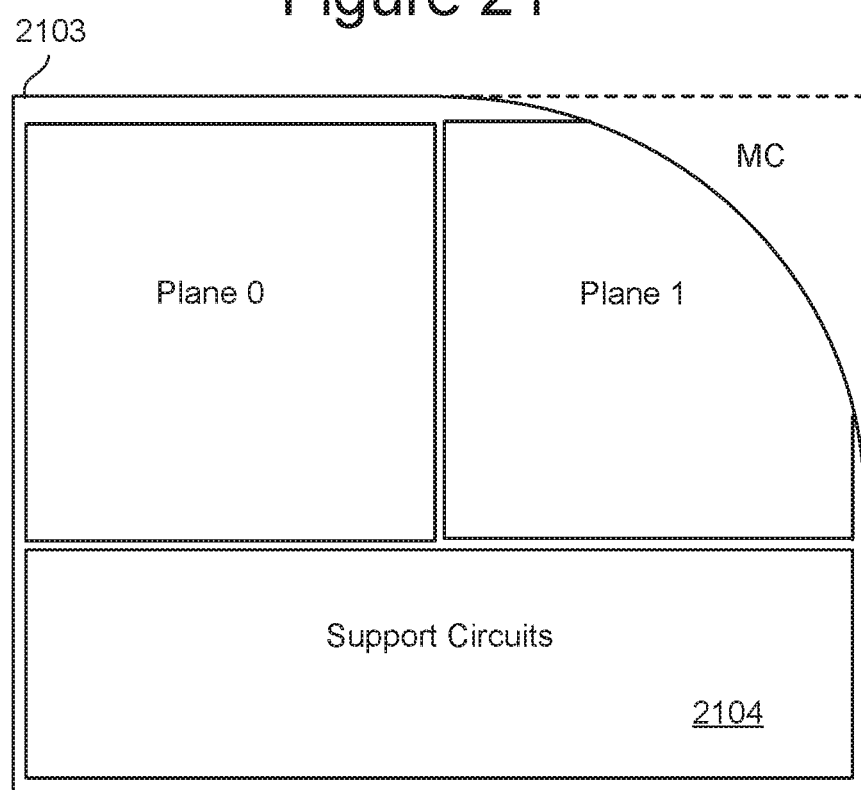

NON-VOLATILE MEMORY WITH FAST PARTIAL PAGE OPERATION

This application claims the benefit of U.S. Provisional Patent Application Ser. No. 62/596,512, filed Dec. 8, 2017, which is incorporated by reference herein in its entirety for all purposes.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 10A shows one plane with two partial pages programmed or written into the plane under an arrangement where the partial pages are distributed across the plane.

FIG. 10B illustrates the word line voltage level along the length of the plane of FIG. 10A when driven from the left-hand side at some intermediate time after beginning to drive a selected word line.

FIG. 21 shows a partial memory die.

DETAILED DESCRIPTION

As memory devices scale down, resistive/capacitive (RC) delays on word lines may be a limiting factor on performance. Currently, parameters used for writing and reading are based on worst case scenarios, such as the RC delay for the memory cell furthest from the word line driver. This slows down writing and reading for the memory cells closer to the word line driver. Therefore, it is proposed to store partial pages in a localized area of the word line. and optimize the writing and reading parameters to minimize RC delays for that localized area. The ability to read and write data at the partial page level also allows for data to be accessed in smaller units, which can also improve performance since the scaling of memory devices has also resulted in often inconveniently large page sizes, Embodiments described below present non-volatile memory systems including a memory structure and a control circuit connected to the memory structure. The memory structure includes one or more planes of non-volatile memory cells. Each plane is divided into a plurality of partial planes. The control circuit is configured to write to and read from the memory cells by writing a partial page into a particular partial plane and reading the partial page from the particular partial plane using a set of parameters optimized for the particular partial plane.

Figure 1A:
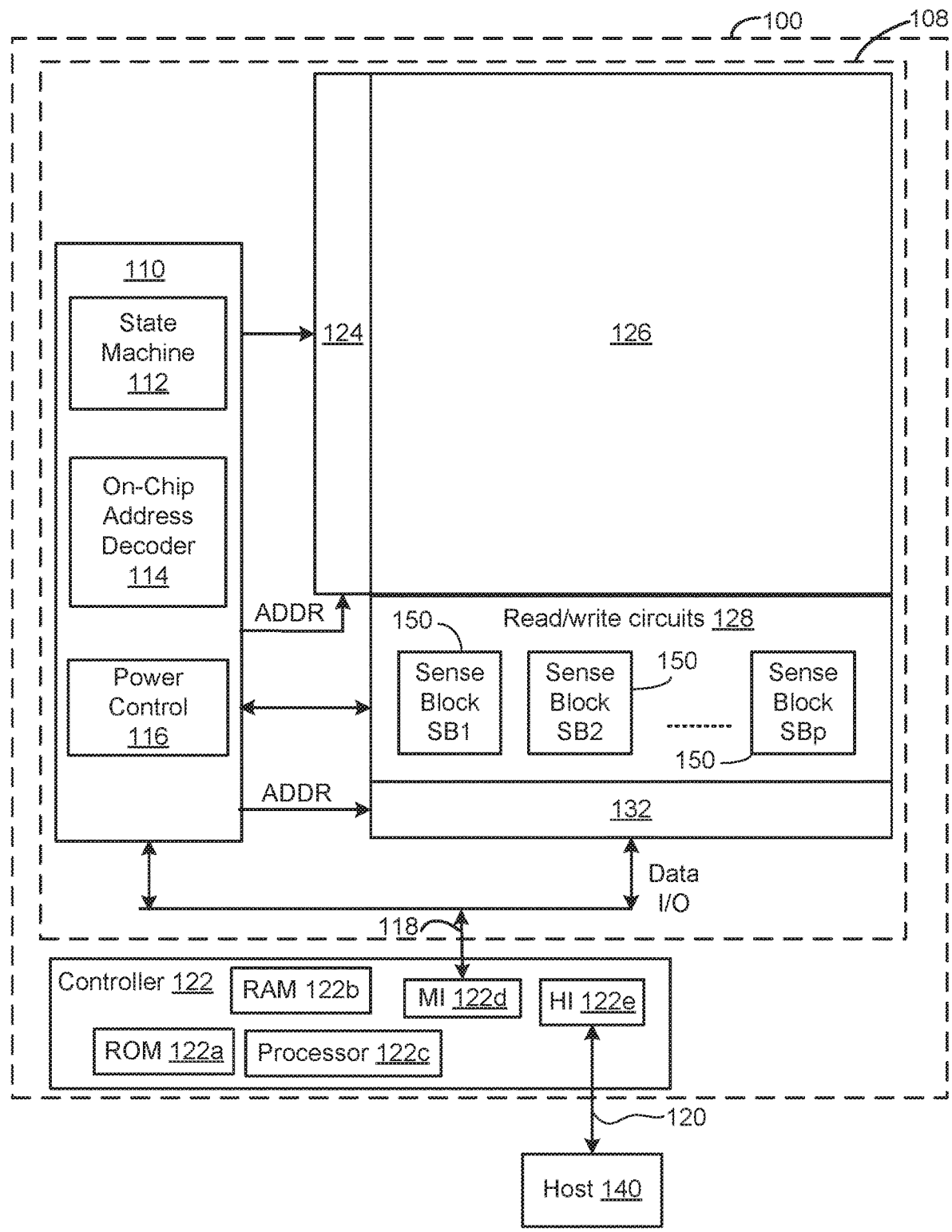
FIG. 1A is a functional block diagram of a memory device.

In some embodiments, to increase performance a die of the memory system stores one bit of data per memory cell and will allow partial page writing and reading, where writing of the data can use a single pulse, no-verify algorithm with the pulse optimized for the particular partial plane into which a partial page is being written. In one embodiment, a page of data includes all memory cells connected to a word line, and partial page writing/reading only operates on a subset of memory cells connected to the selected word line. That is, a partial page is a subset of a page. The partial page can be 25% of the page, 50% of the page, or another percentage or fraction of the page FIGS. 1A-4 describe examples of a memory system that can be used to implement the technology proposed herein. FIG. 1A is a functional block diagram of an example memory system 100. The components depicted in FIG. 1A can be electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The row decoder 124 can include the drivers and other elements to bias the word lines for the different memory operations. The read/write circuits 128 include multiple sense blocks 150 including SB1, SB2, SBp (sensing circuitry) and allow a page of memory cells to be read or programmed in parallel, where a page is the unit in which data is written and/or read. A physical page is the physical unit of a number of cells into which data can be concurrently written and/or read, and a logical page a corresponding logical unit of data written into a physical page.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a state machine 112, an on-chip address decoder 114, and a power control circuit 116. The state machine 112 provides die-level control of memory operations. In one embodiment, state machine 112 is programmable by software. In other embodiments, state machine 112 does not use software and is completely implemented in hardware (e.g., electrical circuits). In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers.

Figure 2:
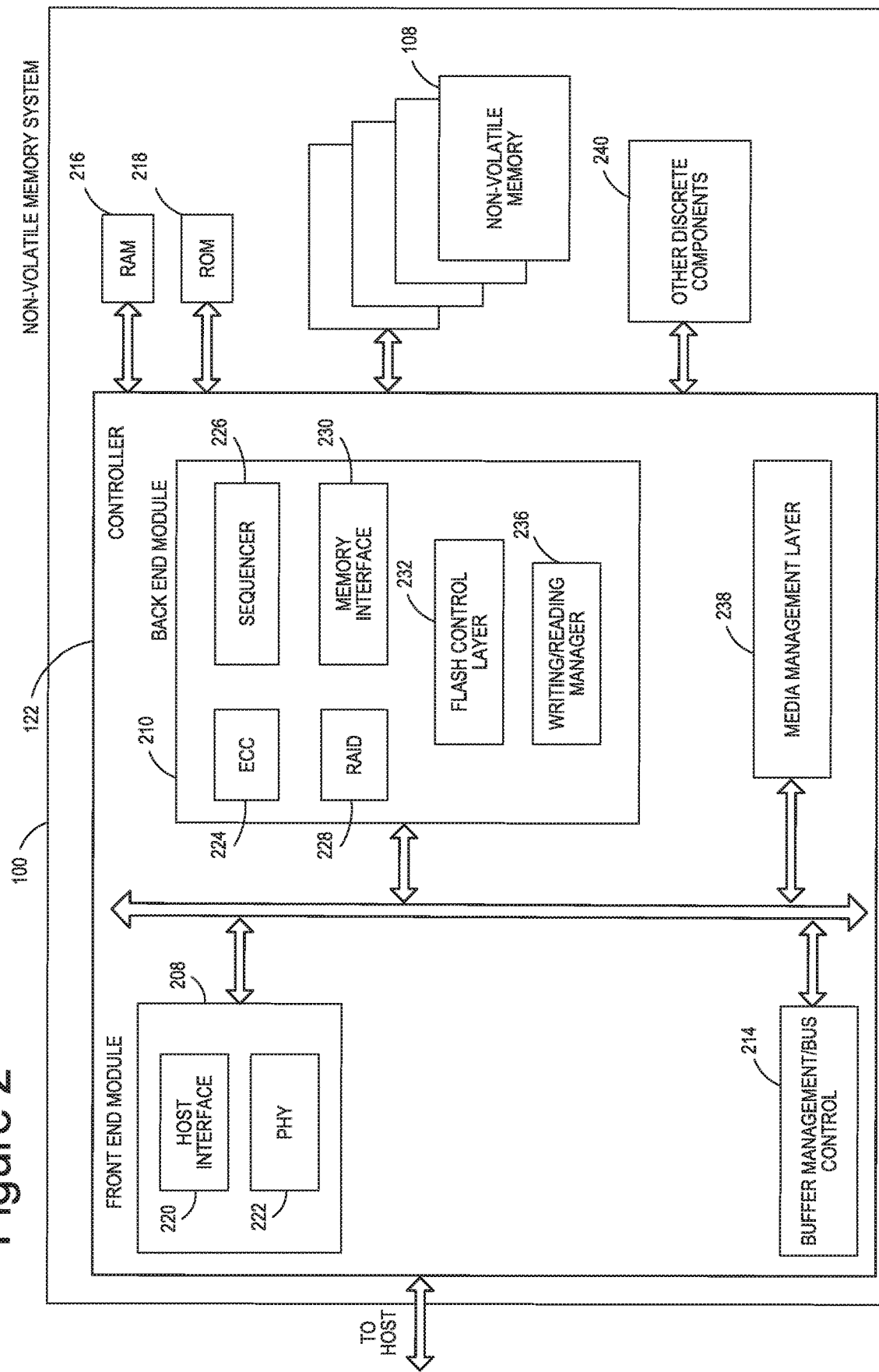
FIG. 2 is a block diagram depicting one embodiment of a memory system.

State machine 112 and/or controller 122 (or equivalently functioned circuits), in combination with all or a subset of the other circuits depicted in FIG. 2, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, FGA, ASIC, integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
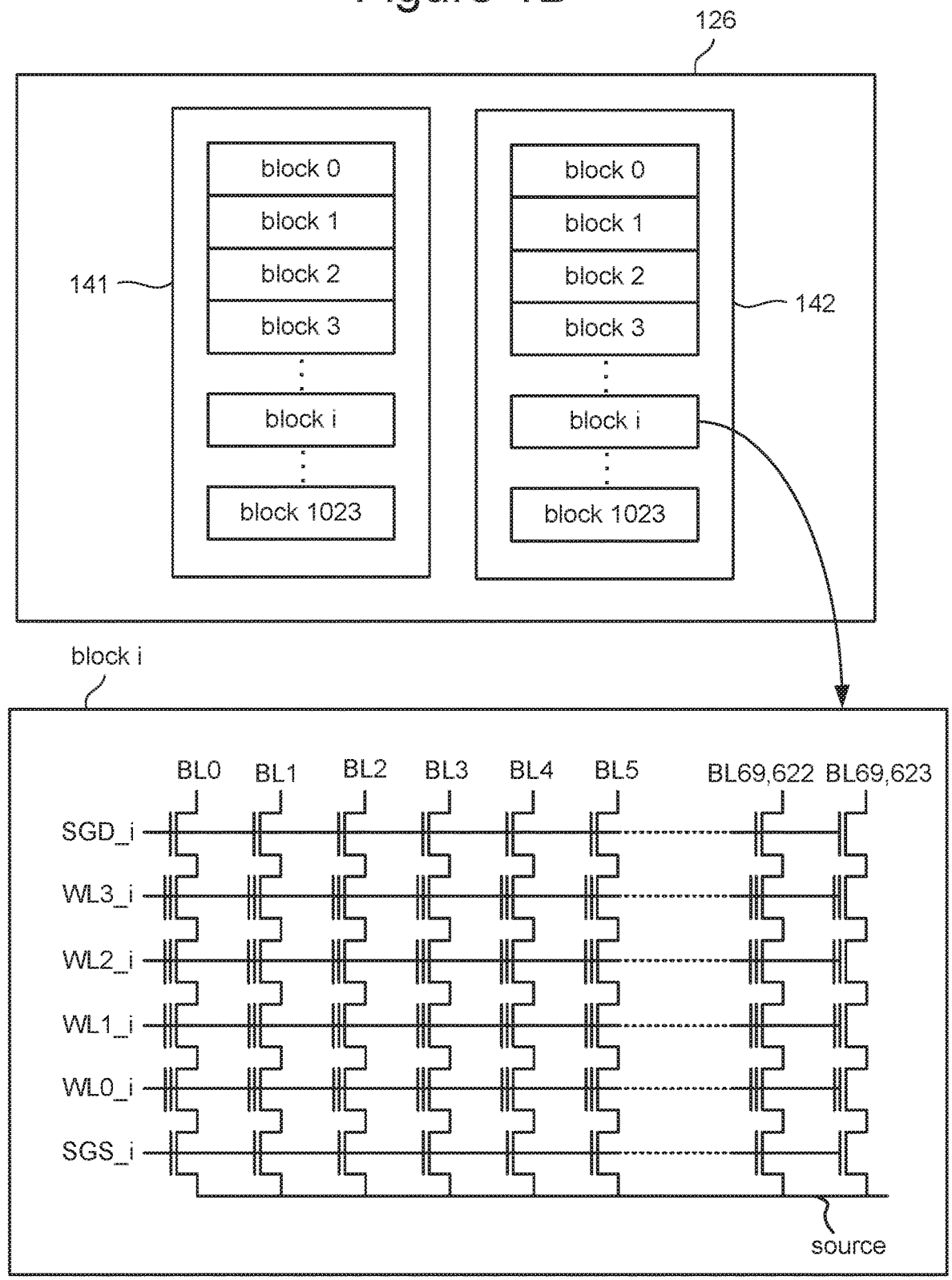
FIG. 1B is a block diagram depicting one example of a memory structure.

FIG. 1B depicts an example of memory structure 126. In one embodiment, an array of memory cells is divided into multiple planes. In the example of FIG. 1B, memory structure 126 is divided into two planes: plane 141 and plane 142. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 1B includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1B shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1B shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid-state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front-end module 208 that interfaces with a host, a back-end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1A (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flow charts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126 of die 108. The MML 238 may be needed because: 1) the memory may have limited endurance; 2) the memory structure 126 may only be written in multiples of pages; and/or 3) the memory structure 126 may not be written unless it is erased as a block. The MML 238 understands these potential limitations of the memory structure 126 which may not be visible to the host. Accordingly, the MML 238 attempts to translate the writes from host into writes into the memory structure 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid-state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3A:
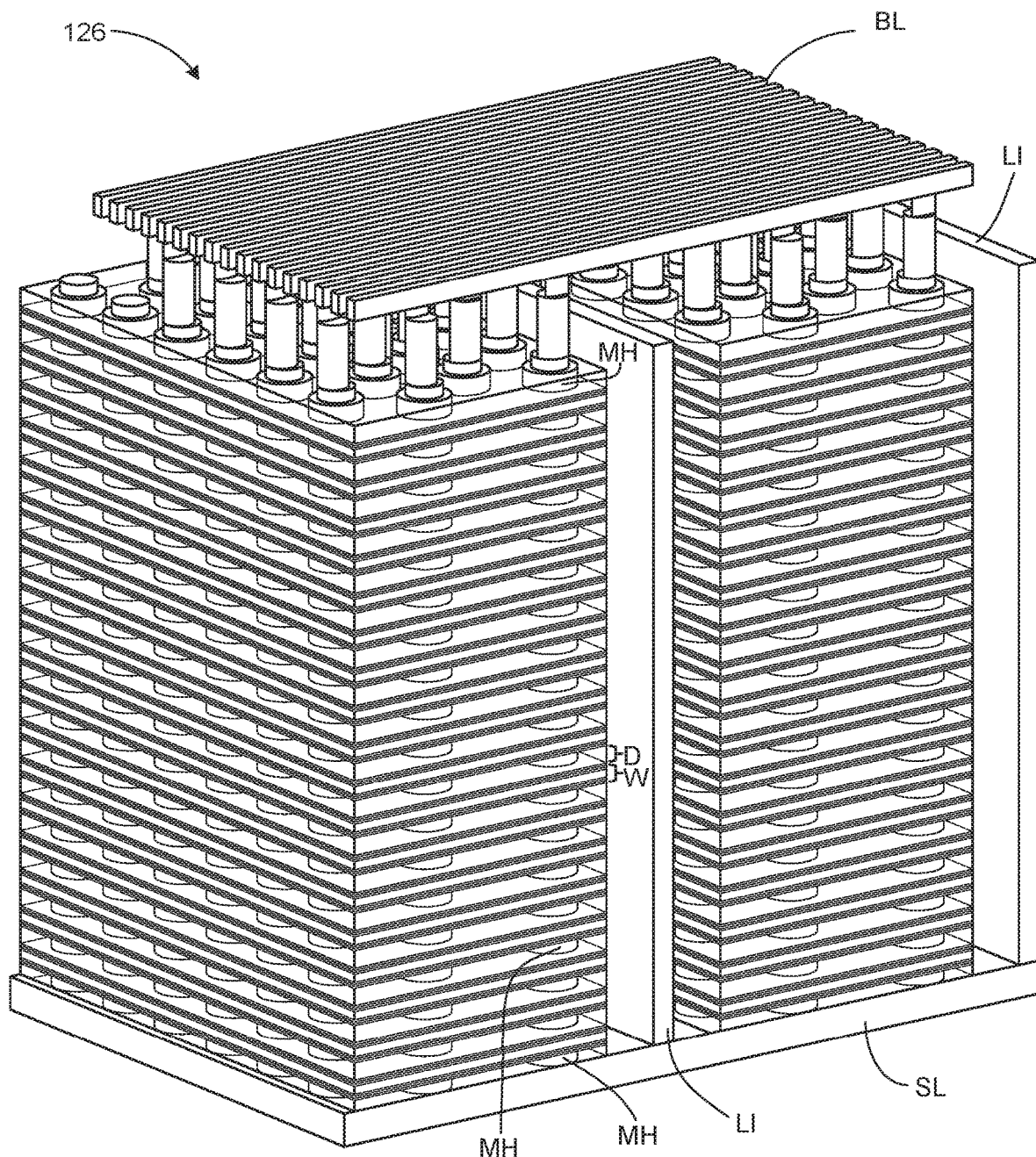
FIG. 3A is a perspective view of a portion of one embodiment of a monolithic three-dimensional memory structure.

FIG. 3A is a perspective view of a portion of one example embodiment of a monolithic three-dimensional memory structure 126, which includes a plurality memory cells. For example, FIG. 3A shows a portion of one block of memory. The structure depicted includes a set of bit lines BL positioned above a stack of alternating dielectric layers and conductive layers. For example, purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3A only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3A, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided with respect to FIG. 3B.

Figure 3B:
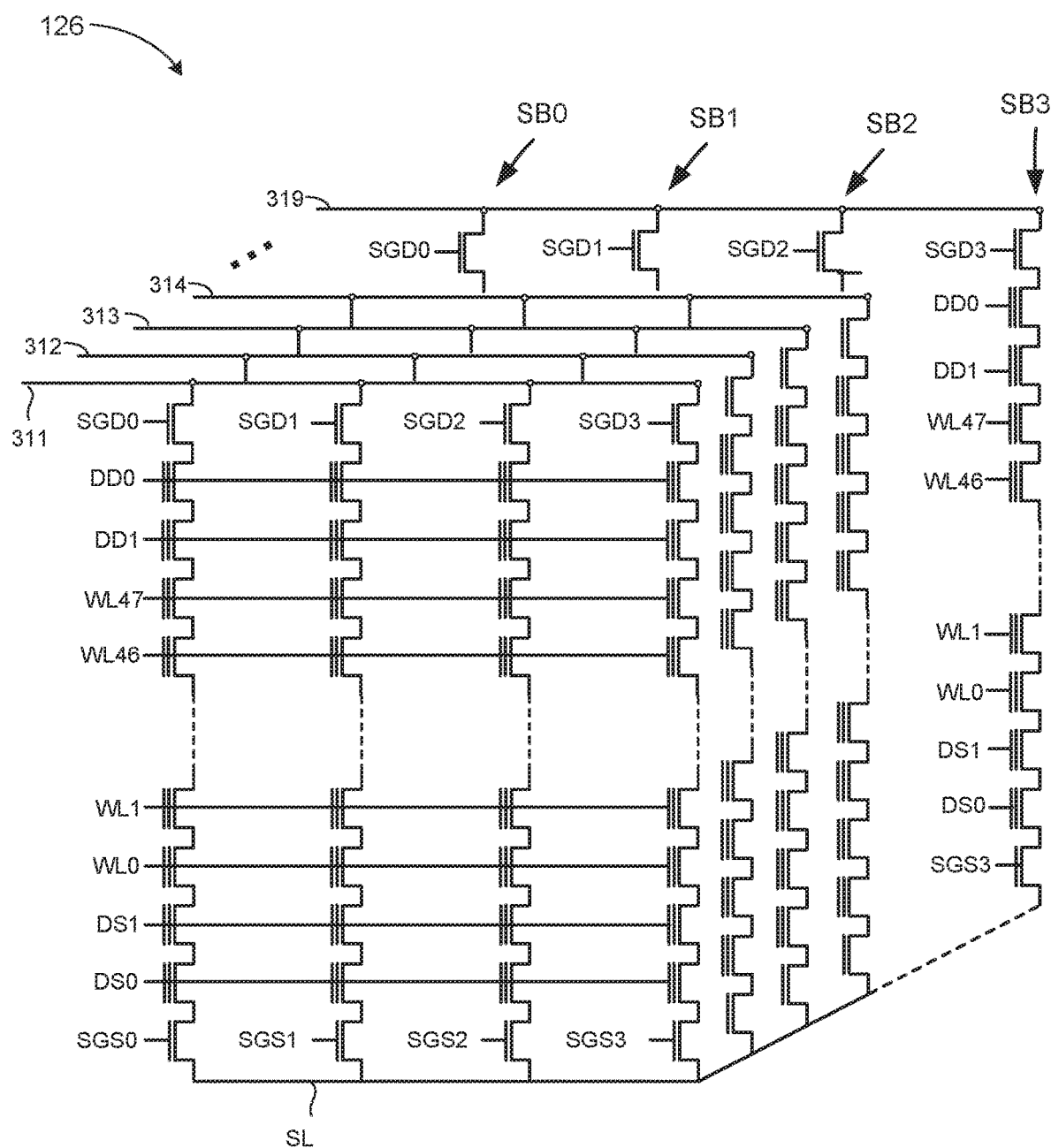
FIG. 3B is a schematic of a plurality of NAND strings.

FIG. 3B depicts an example 3D NAND structure and shows physical word lines WLL0-WLL47 running across the entire block. The structure of FIG. 3B can corresponds to a portion of one of the blocks of FIG. 1B, including bit lines 311, 312, 313, 314, . . . , 319. Within the block, each bit line is connected to four NAND strings. Drain side selection lines SGD0, SGD1, SGD2 and SGD3 are used to determine which of the four NAND strings connect to the associated bit line. The block can also be thought of as being divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 4:
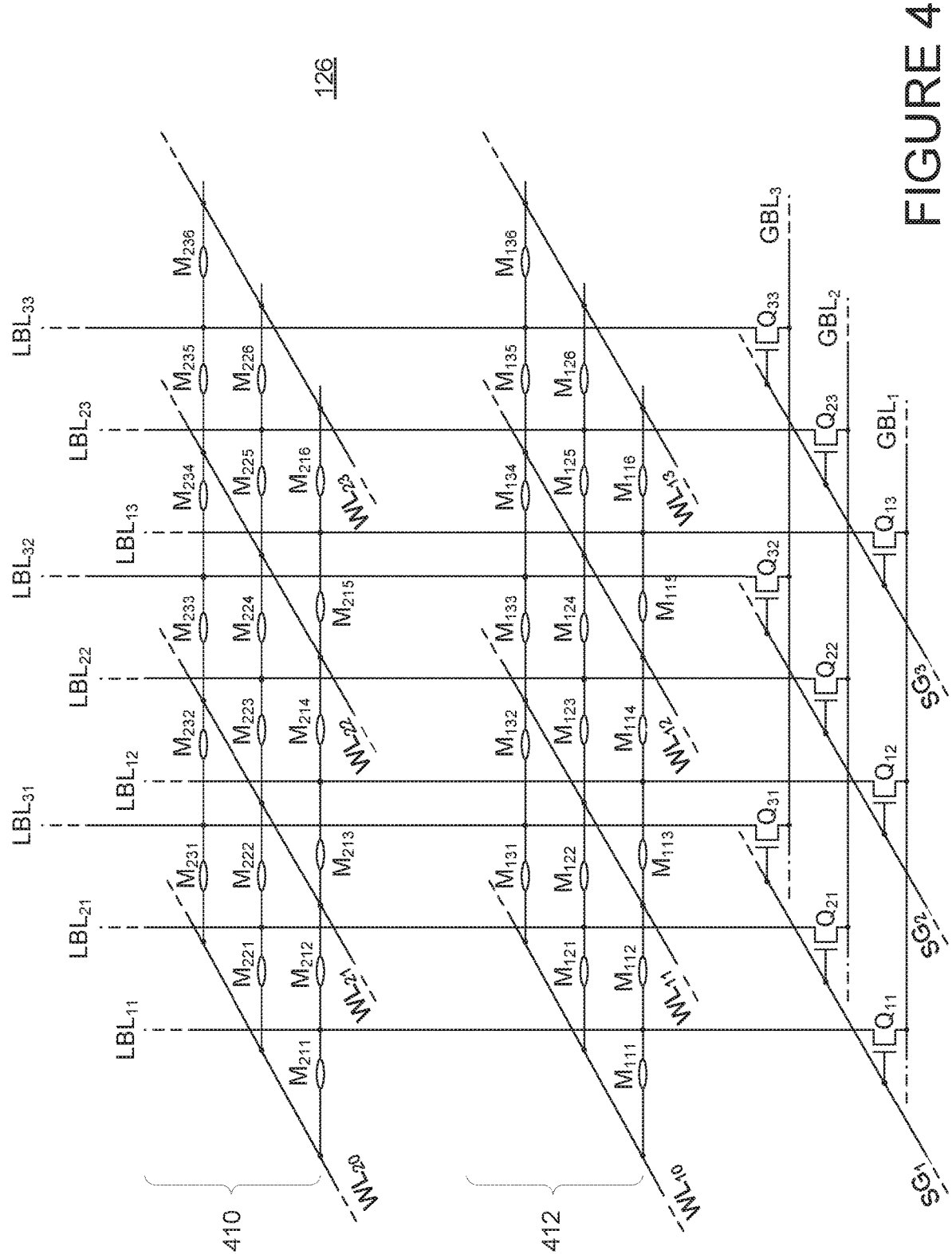
FIG. 4 depicts various embodiments of a portion of a three-dimensional memory array with a vertical cross-point structure.

FIG. 4 illustrates another memory structure that can be used for the structure 126 of FIG. 1A. FIG. 4 illustrates a three-dimensional vertical cross-point structure, the word lines still run horizontally, with the bit lines oriented to run in a vertical direction.

FIG. 4 depicts one embodiment of a portion of a monolithic three-dimensional memory array structure 126 that includes a first memory level 412 positioned below a second memory level 410. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 5:
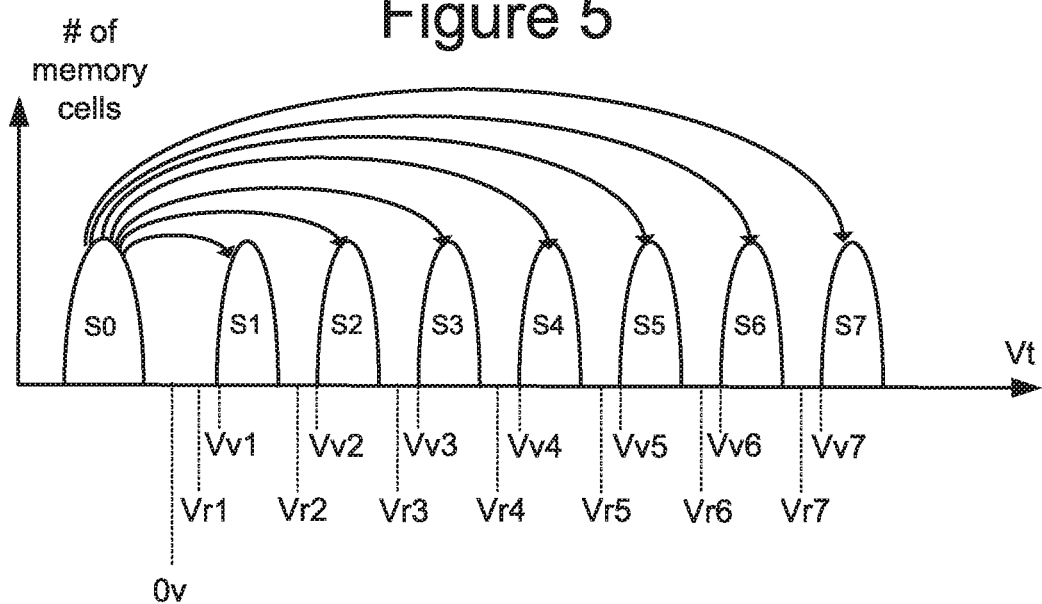
FIG. 5 depicts threshold voltage distributions.

The memory systems discussed above can be erased, programmed/written and read. At the end of a successful programming process, the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, andVr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 6:
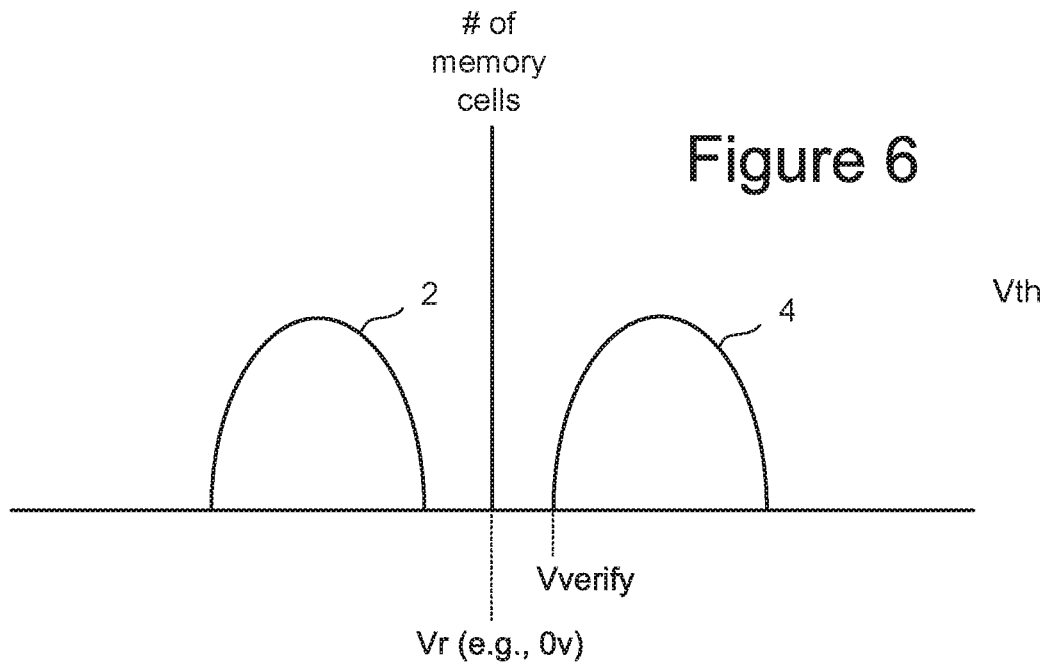
FIG. 6 depicts example threshold voltage when the memory cells store one bit of data per memory cell.

FIG. 6 depicts example threshold voltage when the memory cells store one bit of data per memory cell in a binary or single-level cell (SLC) format. For example, FIG. 6 shows a graph depicting two threshold voltage distributions 2 and 4. The x axis plots threshold voltage and the y axis plots the number of memory cells. Threshold voltage distribution 2 is less than zero volts and threshold voltage distribution 4 is greater than zero volts. In one embodiment, threshold voltage distribution 2 corresponds to erased memory cells that store data "1." In one embodiment, threshold voltage distribution 4 corresponds to programmed memory cells that store data "0." In other embodiments, both threshold voltage distributions can be positive voltages, or both can be negative voltages. The voltage Vverify is the verify reference voltage used to verify whether memory cells have been successfully programmed (see step 774 of FIG. 7B, discussed below). The voltage Vr is the read reference voltage used to sense whether the memory cells are erased or programmed (see step 802 of FIG. 8, discussed below).

The proposed technology described herein can be used for embodiments in which each memory cell stores one bit of data per memory cell (FIG. 6) and for embodiments in which each memory cell stores multiple bits of data per memory cell (FIG. 5).

Figure 7A:
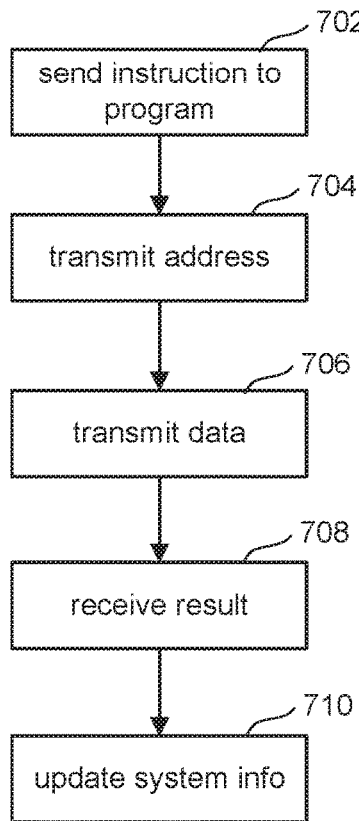
FIG. 7A is a flow chart describing one embodiment of a process for programming/writing.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. Controller 122 (e.g., writing/reading manager 236) can also scramble the data prior to programming the data in the memory.

Figure 7B:
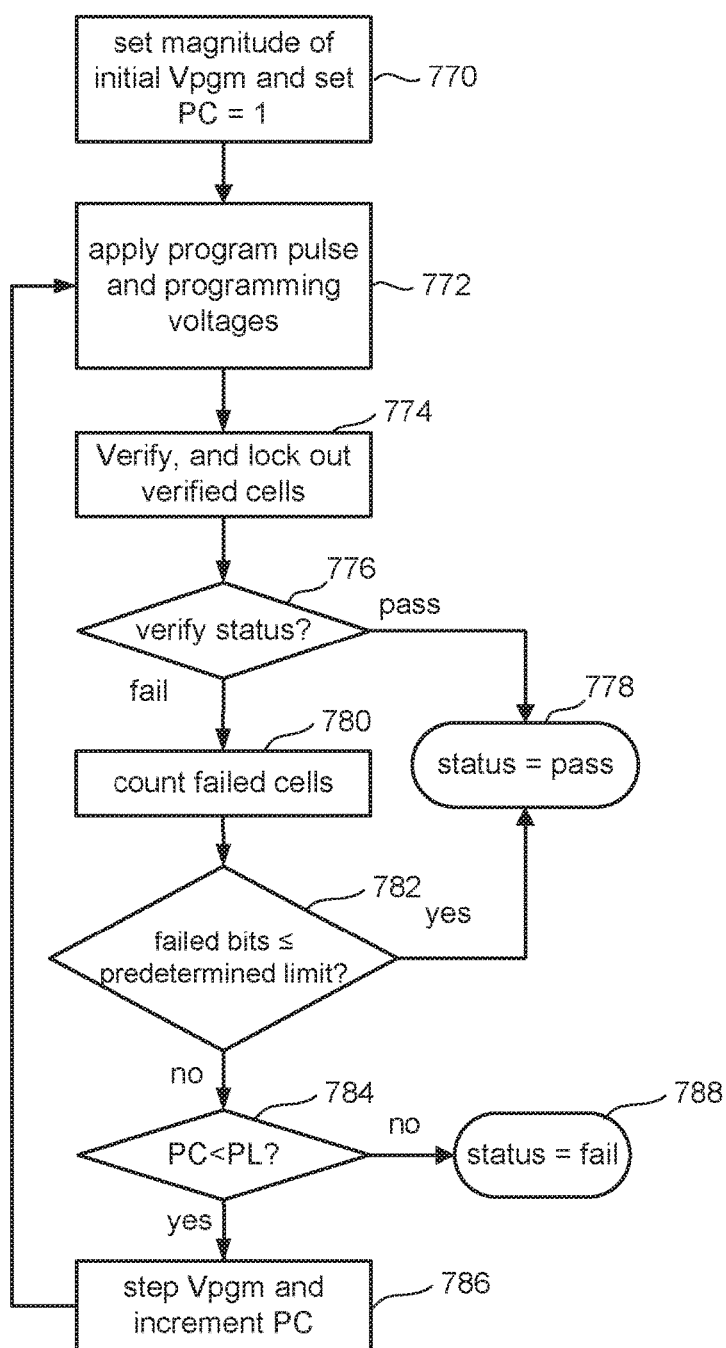
FIG. 7B is a flow chart describing one embodiment of a process for programming/writing data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above (see FIG. 1), at the direction of state machine 112. The process of FIG.

7B can also be used to implement the full sequence programming discussed above. The process of FIG. 7B can also be used to implement each phase of a multi-phase programming process. Additionally, the process of FIG. 7B can be used to program memory cells connected to the same word line with one bit of data per memory cell, as per FIG. 6.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5 or Vr of FIG. 6) or verify operation (e.g. see verify reference voltages Vv1, Vv2, Vv3, Vv4, Vv5, Vv6, and Vv7 of FIG. 5 or Vverify of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Figure 7C:
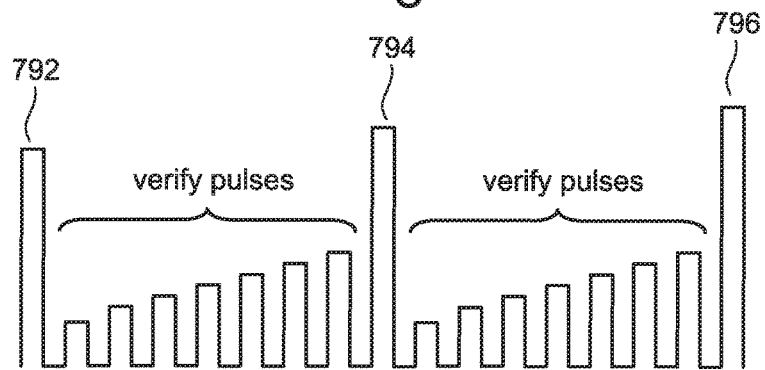
FIG. 7C depicts a word line voltage during programming/writing and verify operations.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Figure 8:
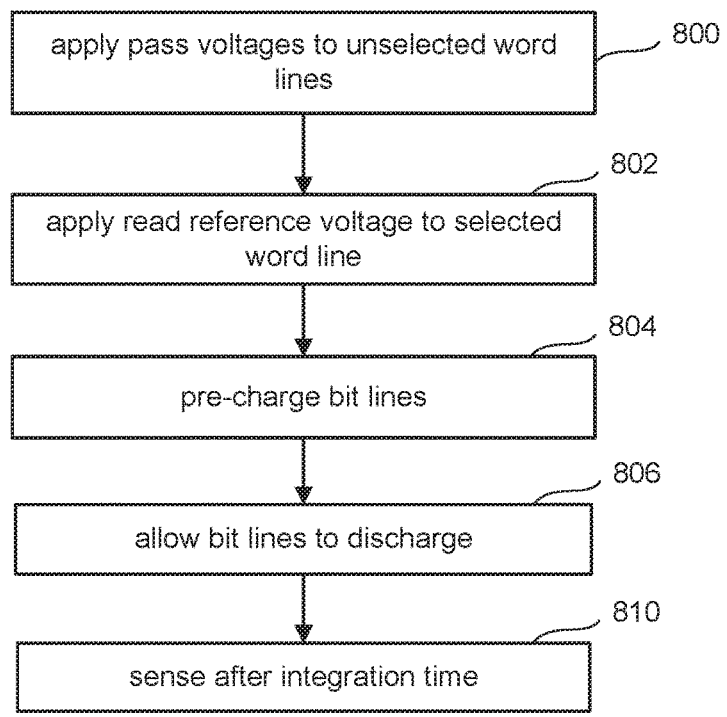
FIG. 8 is a flow chart describing one embodiment of a process for reading data from non-volatile memory cells.

FIG. 8 is a flow chart describing a sensing operation performed in order to read data from the memory cells. In step 800, a pass voltage is applied to unselected word lines so that unselected memory cells on a NAND string are conducting, which enables the system to test whether the selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0v, or a small voltage near 0v. In step 804, all of the bit lines are pre-charged. In one example embodiment, the bit lines are pre-charged by charging a capacitor in the sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 810. If the memory cell conducts in response to Vcgr, then the threshold voltage of the memory cell is less than Vcgr. If Vcgr=0v and the memory cell turns on, then the memory cell is in the erased state and the data stored is 1. If Vcgr=0V and the memory cell does not turn on, then the memory cell is in the programmed state and the data stored is 0.

To increase the storage density of a memory circuit such as in FIG. 1B, 3B or 4, the scale of the circuit elements can shrink, the size of the device can increase, or both. This results in the number of memory cells along a word line increasing. It also means that word lines can be both longer and closer together. This has a number of consequences.

One consequence relates to the biasing of the word lines. In an array structure as in FIG. 1B, 3B or 4, to bias a word line for a memory operation, such as for a write or sensing operation as described above with respect to FIGS. 7A-C and 8, a voltage is applied to one or both ends of the word line by a word line driver, such as can be included in the decoders 124 of FIG. 1A. Word lines are commonly driven from one end, but in some embodiments use drivers on both ends. In either case, when a voltage is applied to a word line, the rate at which the voltage along the word line rises in response to the applied voltage depends on the resistive/capacitive (R/C) properties, namely the RC constant, along the word line. This is illustrated with respect to FIG. 9, which is a graph showing a select word line voltage (VselWL) versus a distance from a word line driver over three different times, $t_1$, $t_2$, and $t_3$, where $t_1 < t_2 < t_3$.

Figure 9:
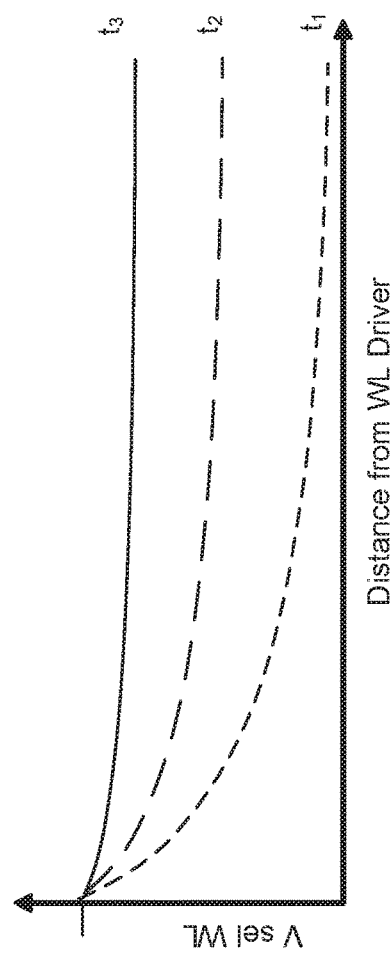
FIG. 9 illustrates the RC characteristics of a selected word line over time in response to an application voltage.

In FIG. 9, a voltage, such as a program voltage level Vpgm or read voltage level Vcgr, is applied to a selected word line. The word line will be capacitively coupled to adjoining word lines that, if non-selected, will be at a lower voltage level, such as the lower level pass voltages used for non-selected word lines in a write or read operation of a NAND array. Consequently, although the word line may be at the Vpgm or Vcgr level at the driven end, away from the word line driver the word line will rise up at a rate dependent upon the RC constant along the word line. This is illustrated in FIG. 9 by the three different times $t_3 > t_2 > t_1$ after the voltage is first applied, where at $t_1$ the voltage level at the far end of the word line is still near ground, has risen around half way to the applied voltage at $t_2$, and is asymptotically approaching the applied level at $t_3$. Other embodiments can drive the word line from both ends to help with this situation, but the voltage level along the word line will still dip in the middle with catenary-like curve whose center rises over time. In either case, the voltage level along the portions of word lines further from the drivers will lag and only asymptotically approach the desired level, affecting performance. Consequently, when accessing a full page of all the memory cells of a page connected along a word line, the timing and biasing levels will need to account for this variation.

Another consequence of having more memory cells connected along a given word line is a large page size. As described above, in one embodiment a page is the unit of operation for programming (writing) and reading. In one example, a page is all the data stored in all memory cells connected to a common word line. In other embodiments, a page can be one bit of data from each memory cell connected to a common word line. In other embodiments, pages can include other aggregations of data. In one example, a page of data is 16 KB. In some embodiments, the system requires all writing and reading to be by the page. Although such a large page size can increase efficiencies and storage densities when accessing larger quantities of data, hosts may want to frequently access the memory for read and write operations of smaller amounts of data, such as for 2 KB or 4 KB. When a host makes frequent memory accesses from these smaller amounts of data, having to access at only the level of such a large page will hurt performance. To account for this, in other embodiments the system allows partial pages to be written to and read. Example of a partial page can be 2 KB or 4 KB. Other subsets of a page can also be used as a partial page.

In some embodiments, when a partial page is written to memory, the partial page of data is broken up into a number of chunks and those chunks are scrambled using any one of various scrambling techniques. One reason to scramble the data is that if there is a physical fault in the memory, the errors in the data will be spread out over the page or partial page, thereby, making it easier for error correction to fix the errors. For purposes of this document, a chunk of data is a grouping of a subset of the data.

In previous memory systems, a partial page is spread out across a plane. This way, if an area of the array has or develops a defect, the defect may not all be concentrated in a single partial page, allowing for a better chance of data recovery. Also, this can make the layout of column decoding circuitry easier. For example, FIG. 10A shows plane 920, which can be plane 141 of FIG. 1B, plane 142 of FIG. 1B or another plane. Some embodiments of the memory system only include one plane. Other embodiments include multiple planes. FIG. 10A shows one plane with two partial pages programmed or written into plane 920. The first partial page of data (partial page of the logical page) includes chunks 918*a*, 918*b*, 918*c*, 918*d* and 918*d*. Depending on the embodiment, a chunk can be a column of several bit lines, a single bit line, or multiple columns. The second logical partial page is broken into chunks 919*a*, 919*b*, 919*c*, 919*d* and 919*e*. As can be seen, the chunks 918*a-e* and 919*a-e* are physically spread across the width of plane 920. Each chunk represents data stored in multiple memory cells connected to different bit lines. Plane 920 includes bit lines as columns and word lines as rows.

FIG. 10A explicitly represents one of the word lines WL 909 spanning the plane 920, connected on the one side to a word line driver 911. The chunks 918*a*, 919*a* are closest to the word line driver 911 while chunks 918*e*, 919*e* are furthest from the word line driver 911. In other embodiments, the word line driver can be on the other side or the word line driver can be on both sides. In any of these embodiments, as a result of the long length of the word lines that run across the entire plane 920, there is an RC delay for each of the word lines that causes a delay to allow for the voltage applied on the word line to settle to its steady state. That voltage settles faster at the side near the driver 911 and slower at the side further from the driver 911. The programming parameters used to configure a programming operation (see e.g., FIG. 7B) will take into account the worst-case scenario, such as the RC delay experienced at the far side. Thus, programming for chunk 918*a* will be slowed down so that it programs at the same speed as chunk 918*e*, even though chunk 918*a* will have a faster settling time for the word line voltage. This causes the overall timing of a programming process to be longer. This situation is illustrated schematically in FIG. 10B.

FIG. 10B illustrates the word line voltage level along the length of the plane 920 when driven from the left-hand side at some intermediate time after beginning to drive a selected word line at Vcgr or Vpgm, similar to FIG. 9 at the time $t_2$. Superimposed are the chunks 918*a* and 919*a* nearest to the WL driver 911 from the respective first and second partial pages and the chunks 918*e* and 919*e* furthest from the WL driver 911 from the respective first and second partial pages. Although word line WL 909 will have similar behavior for the memory cells of chunks 918*a* and 919*a*, these belong to different partial pages and must respectively be accessed along with the chunks 918*e* and 919*e*. To overcome this problem, it is proposed to store the partial pages in a localized area of the plane 920, and optimize the writing and reading parameters to minimize RC delays for that localized area.

Figure 11:
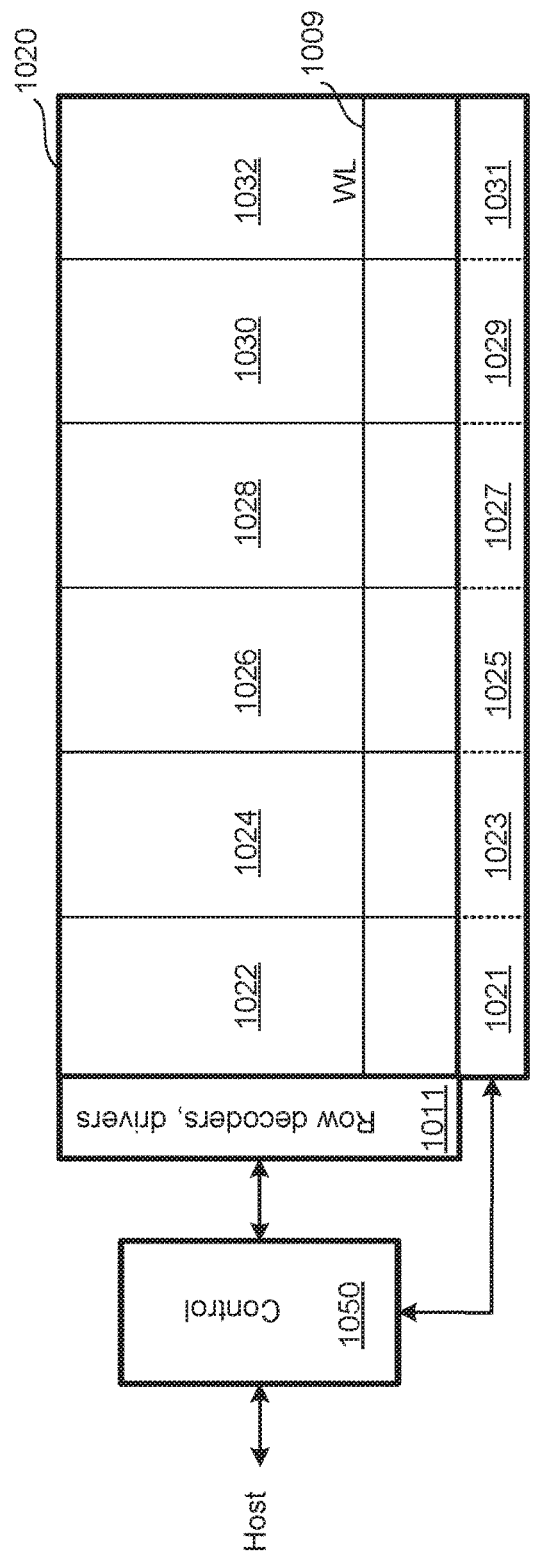
FIG. 11 depicts a plane subdivided up into partial planes.

For example, FIG. 11 shows a plane 1020 of memory structure 126 that has been divided into partial planes 1022, 1024, 1026, 1028, 1030 and 1032. In other embodiments, more or less than six partial planes can be used. In one embodiment, each of the partial planes are zones within the plane that include a contiguous and continuous set of bit lines, NAND strings, and memory cells. Within this set of non-interleaved bit lines can be included spare or redundant columns or memory cells to allow for defect remapping within the same partial plane, so that the word line along any remapped memory elements will have similar RC behavior after remapping. FIG. 11 also includes additional elements of one embodiment of FIG. 1A in simplified form. Along the left side of the plane 1020 a row decoder 1011, including word line drivers, which is connected to the word lines of plane 1020, where one example WL 1009 is shown. Along the bottom of plane 1020 are the column decoders and read/write circuits corresponding to elements 128 and 132 of FIG. 1A. In this example, the column decoders are schematically broken up into sections 1021, 1023, 1025, 1027, 1029, and 1031 for respective partial planes 1022, 1024, 1026, 1028, 1030, and 1032. The control circuitry 1050 corresponds to control circuitry 110 of FIG. 1A and connects to the row and column circuitry to oversee the memory access operations. The array can be accessed at the page, partial page, or combination of partial pages based on the how the bit line columns of the partial planes are biased by the column circuitry of sections 1021, 1023, 1025, 1027, 1029, and 1031. For example, to access partial plane 1022 for a write operation, the selected bit lines would be program enabled and non-selected bit line program inhibited by column circuitry section 1021, while all of the partial planes 1024, 1026, 1028, 1030 and 1032 would be program inhibited by the corresponding column circuitry sections 1023, 1025, 1027, 1029 and 1031. Similarly, in a read operation, only the selected bit lines of the selected partial plane would need to be biased for a read operation by, for example, pre-charging operations in the corresponding sense amplifiers.

In one embodiment the partial planes are created in advance and set in ROM parameters during the manufacturing phase. In other embodiments, the partial pages are determined dynamically by the state machine of control block 1050 or controller 122. For example, the partial planes can be determined the first time a plane is used, the first time a block is used, when a programming process is performed, when a reading process is performed, etc. Once partial planes are determined, then a partial page is written into a single partial plane. Each partial plane will have its own set of operational parameters optimized to that partial plane, for example, to optimize the RC delay. Because partial plane 1022 will see a smaller RC delay than partial plane 1032, partial plane 1022 can have a different set of operational parameters that wait less time for the word line voltage to settle to steady state and/or drives lower voltages for the word line.

In some embodiments, the arrangement of partial pages into partial planes can be performed on the memory chip by the control block 1050, so that the storing of partial pages in a compact partial plane as illustrated in FIG. 11 can be transparent to the controller 122. This is represented schematically in FIG. 11 with the column decoders broken up into sections 1021, 1023, 1025, 1027, 1029, 1031 for the different partial planes 1022, 1024, 1026, 1028, 1030 and 1032. In some embodiments, both the arrangement of partial pages onto the partial planes and data scrambling with the partial pages can be handled on the memory chip.

The operational parameters optimized for the specific partial page or combination of partial pages can include programming parameters and sensing parameters, for both read and program verify operation. Examples of programming parameters optimized for a particular partial plane include the programming voltage amplitude, programming voltage duration, starting programming voltage, programming voltage step size, programming voltage settling time, for both multi-level cell (MLC) writing and binary, or single level cell (SLC), writing. Examples of sensing parameters include the read reference voltage, read reference voltage kicker, read pass voltage, read reference voltage settling time, verify reference voltage, verify reference voltage kicker, verify reference pass voltage and verify reference voltage settling time. The read reference voltage kicker is an additional amount of voltage added to the read reference voltage in order for the read reference voltage to be seen at memory cells furthest from the word line driver. Similarly, the verify reference voltage kicker serves the same purpose.

Since the RC constant of a word line depends on the voltage difference between a word line and its adjacent word lines, in a NAND array the effect is greatest between a selected word line and its adjacent non-selected word lines, as the non-selected word lines will be driven at the same or similar voltage in writing and sensing operations. Consequently, in some embodiments, non-selected word lines can use the same parameters across all sub-planes. Other embodiments can optimize non-selected word line parameters on a sub-plane level, as in some embodiments non-selected word lines may be biased to different values, such as for boosting of non-selected, but adjacent word lines. Similarly, depending on the embodiment, dummy word lines and select gate lines may or may not be discriminately biased base on the sub-plane.

Figure 12A:
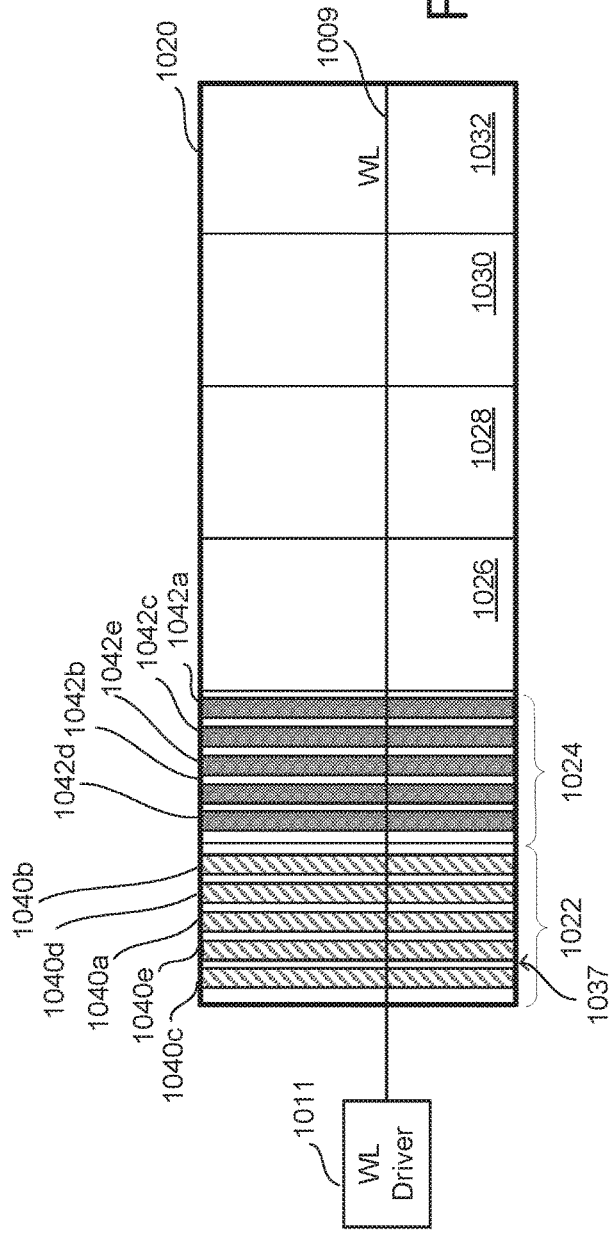
FIG. 12A shows two partial pages programmed into two partial planes.

FIG. 12A again shows a plane 1020 of memory structure 126. Plane 1020 can be plane 141 of FIG. 1B, plane 142 of FIG. 1B or another plane. In this embodiment, plane 1020 is broken up into six partial planes, 1022, 1024, 1026, 1028, 1030, and 1032, but other embodiments can use different number of partial planes. One of the array's word lines, WL 1009, is explicitly represented and is shown driven from the left by word line driver 1011. FIG. 12A shows two partial pages programmed into plane 1020. The first partial page is broken into chunks 1040a, 1040b, 1040c, 1040d, and 1040e. The second partial page is broken up into chunks 1042a, 1042b, 1042c, 1042d and 1042e. As can be seen, in this embodiment, logical chunks 1040a-e are all programmed into the same partial plane 1022 and chunks 1042a-e are all programmed into the same partial plane 1024. In the embodiment of FIG. 12A, the chunks of data are scrambled. For example, the layout of the storage of chunks 1040a-e from left to right is 1040c, 1040e, 1040a, 1040d and 1040b; and the layout of the storage of chunks 1042a-e from left to right is 1042d, 1042b, 1042e, 1042c and 1042a. Other orders of scrambling can also be used. In the embodiment depicted in FIG. 12A, the two partial planes have their chunks scrambled differently. In other embodiments, all partial planes will have their chunks scrambled in the same manner.

Figure 12B:
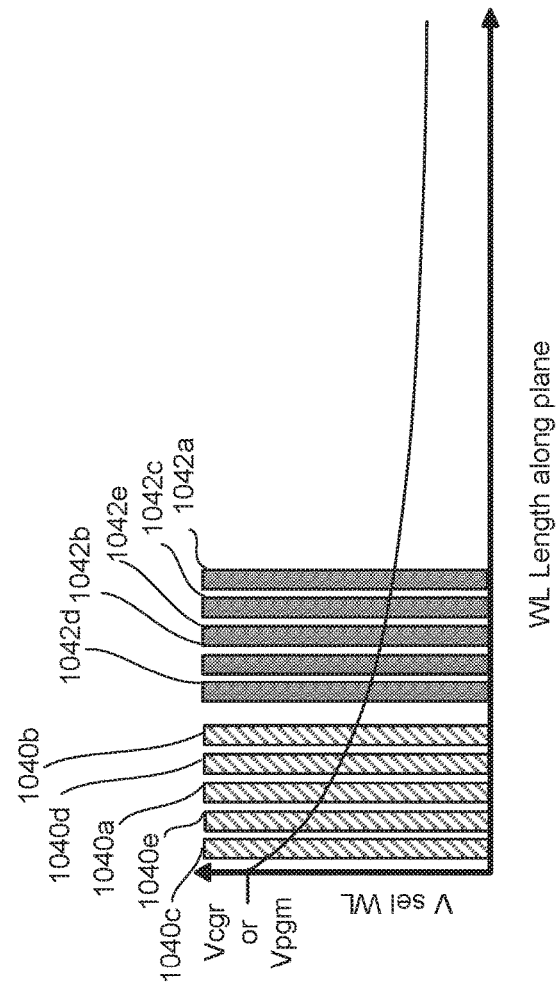
FIG. 12B illustrates the word line voltage level along the length of the plane of FIG. 12A when driven from the left-hand side at some intermediate time after beginning to drive a selected word line.

FIG. 12B is similar to FIG. 10B and again illustrates the word line voltage level along the length of the plane when driven from the left-hand side at some intermediate time after beginning to drive a selected word line at Vcgr or Vpgm. Superimposed are the chunks 1040a-e from partial plane 1022 nearest to word line driver 1011 and chunks 1042a-e in the next partial page 1024. This schematic representation illustrates that within a given partial plane the word line will behave more similarly, allowing for the read or write parameter to be optimized for the particular partial plane while accessing a partial page using that partial plane.

Note that FIG. 12A shows that each of the chunks for a same page or partial page (e.g., chunks 1040a, 1040b, 1040c, 1040d, and 1040e) can separated from each other within the particular partial plane by gaps (e.g., gap 1037 between chunks 1040c and 1040e) that comprise intervening memory cells in that same particular partial plane. Therefore, it is possible to interleave two logical pages within the same partial plane. In other words, there can be gaps between each of the chunks of the partial page and logical pages can be programmed into memory cells in those gaps. In other embodiments, there are no gaps between each of the chunks of the partial page. In some embodiments, each partial plane is used to store only one partial page of data. In other embodiments, a partial plane can store multiple partial pages of data. Note that a partial plane is a physical location in the memory while a partial page is a logical grouping of data.

In FIGS. 11 and 12A, each of the partial planes is shown as a contiguous or non-interleaved set of bit lines, as these will correspond to regions of a word line having similar resistive/capacitive (R/C) behavior. To maintain this uniformity of RC behavior, any redundant memory cells, such as spare bit lines or columns used for defect remapping, should be in the same partial plane. For example, redundant columns could be included with the gaps such as shown at 1037 so that any remapping can be done at the partial plane level. For embodiments where a word line is driven from both ends, the word line level will rise from both ends with the center lagging, and columns the same distance from the center of the word line in either direction will have similar behavior. In this case, partial planes in some embodiments can be formed symmetrically about the center of the full plane: for example, referring to FIG. 11, the combination of 1022 and 1032 could form one partial page, 1024 and 1030 could form another partial page, and 1026 and 1028 a third partial page.

More generally, a partial page can be written in a partial plane of memory cells along portions of the word lines that have similar resistive/capacitive behavior. For example, referring again FIG. 11, the shown partial planes might partially interleave along the edges.

As discussed above, some embodiment of the memory systems will scramble the data prior to programming. In the embodiment of FIG. 12A, the data within the chunks can be scrambled and the chunks can be scrambled. That is a control circuit (the state machine 112 of FIG. 1A, on-die circuitry of control block 1050 of FIG. 11, or the controller 122 of FIG. 2) can be configured to scramble the data within a particular partial plane. In some embodiments, each partial plane will be unique to a partial page. In other words, each partial page will have its own partial plane. Since each partial page location (and partial plane location) is known, the system knows the delays associated with these partial pages and optimized parameters just for that partial plane. This way all partial pages can be programmed/read faster as the spacing between near and far memory cells in a given partial page is smaller than before.

For example, old memory systems use one value for the initial programming voltage, regardless of where in the plane the programming is being performed. Additionally, the same settling time is used for all memory cells to allow the word line to settle when applying a program pulse. In the arrangement of FIG. 12, different values for different partial planes are used for the initial program voltage and program voltage settling time. In other embodiments, the magnitude of the program pulses can be different.

In old memory systems, the same values are used for each of the read reference voltage, read reference voltage kicker and the read reference voltage settling time, regardless of the distance from the word line driver. In the proposal of FIGS. 12A and 12B, different values can be used for each of the read reference, the read reference voltage kicker and/or the read reference voltage settling time depending on distance from the word line drivers (e.g. 1011), which is determined based on which partial plane the partial page is stored within. As program verify is performed in a similar manner to read, the analogous parameters for verify can also be changed in the same manner as read parameters.

Figure 13:
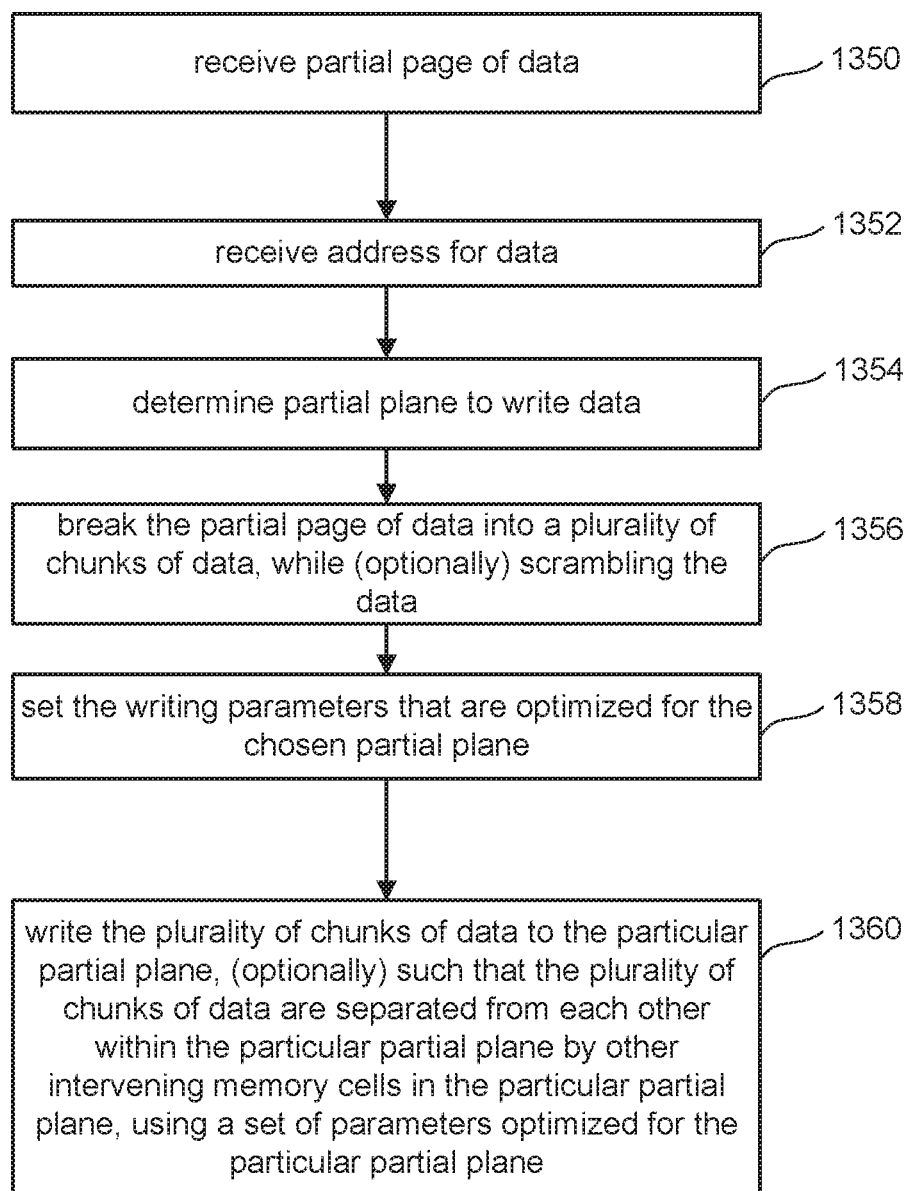
FIG. 13 is a flow chart describing one embodiment of a process for writing data.

FIG. 13 is a flow chart describing one embodiment of a process for writing data. The process of FIG. 13 can be performed by controller 122 and/or memory die 108 (at the direction of state machine 112 using the components of FIG. 1A). In step 1350, a partial page of data is received. For example, the page of data is received at memory die 108 by control circuitry 110 (see lines 118). In step 1352, an address for that data is also received by memory die 108 at control circuitry 110 (see lines 118). In step 1354, state machine 112 determines which partial plane to write the data. In step 1356, the partial page is broken up into a plurality of chunks of data. In some embodiments, the data is scrambled when breaking up the data into chunks. In other embodiments, no scrambling is performed. In step 1358, the write parameters are set for the writing process. In one embodiment, there is one set of write parameters for each partial plane. In one embodiment, steps 1350-1358 are performed by control circuitry 110 of memory die 108 (at the direction of state machine 112). In other embodiments, steps 1350-1358 are performed by controller 122. In step 1360, the plurality of chunks of data are written to the particular partial plane such that the plurality of chunks of data are separated from each other within the particular partial plane by other intervening memory cells in the particular partial plane, using the set of parameters optimized for the particular partial plane. In one embodiment, the process of step 1360 is implemented by performing the process of FIG. 7B. In some embodiments, the plurality of chunks of data that are written to the particular partial plane are not separated from each other within the particular partial plane.

Figure 14:
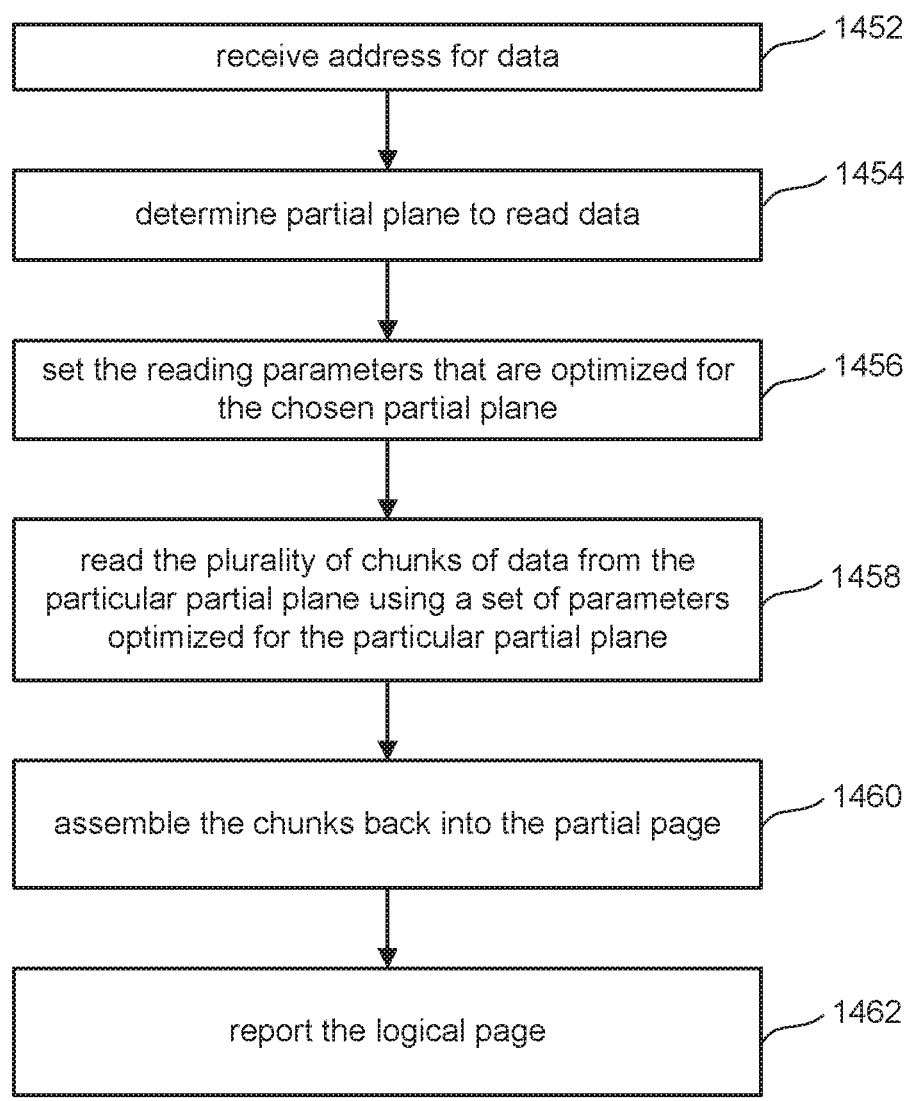
FIG. 14 is a flow chart describing one embodiment of a process for reading data.

FIG. 14 is a flow chart describing one embodiment of a process for reading data. The process of FIG. 14 can be performed by the components of FIG. 1A on memory die 108. In other embodiments, one or more of the steps of FIG. 14 can be performed by controller 122. In step 1452, an address for data is received. In step 1454, based on that address, the partial plane is determined for reading the data. In step 1456, the parameters for the read process are set. The parameters are chosen from different sets of parameters. The system chooses the parameters optimized for the partial plane chosen in step 1454. In one embodiment, step 1456 is performed by state machine 112. In another embodiment, step 1456 is performed by controller 122. In step 1458, the system reads the plurality of chunks of data from the particular partial plane chosen in step 1454. The reading is performed using the set of parameters chosen in step 1456 that are optimized for the particular partial plane chosen. In one embodiment, the process of step 1458 is performed by using the process of FIG. 8. In step 1460, memory die 108 assembles the chunks that were read into a partial page. In one embodiment, step 1460 is performed by state machine 112 and/or control circuitry 110. In another embodiment, step 1460 is performed by controller 122. In step 1462, the logical page that was read from the memory cells is reported back to the host.

Note that the above discussion describes writing and reading partial pages. However, the technology described herein can also be used for writing and reading full pages, combinations of partial pages or other quantities of data. For example, instead of referring to partial pages, the above discussion can refer to "quantity of data."

Figure 15:
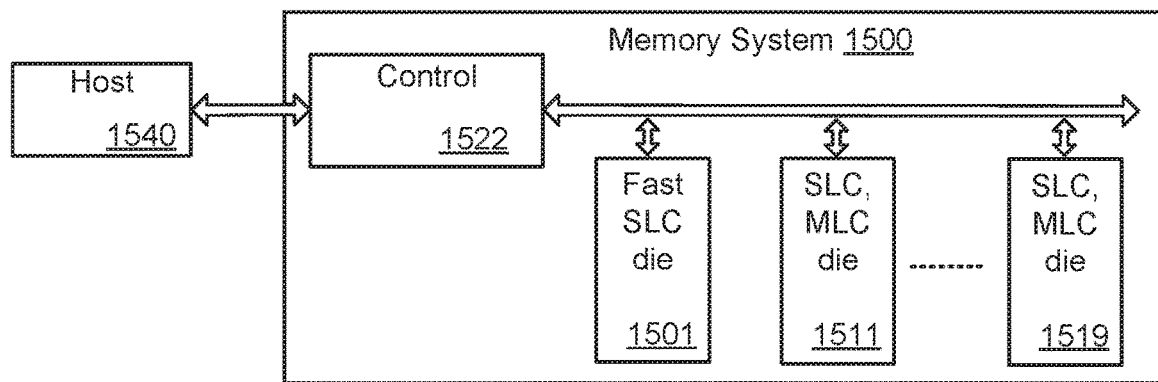
FIG. 15 illustrates an example of a non-volatile memory system that can use embodiments of the partial plane arrangements.

FIG. 15 illustrates an example of a non-volatile memory system that can use embodiments of the partial plane arrangements described above. A host 1540 is connected to a non-volatile memory system 1500, such as a solid-state drive (SSD) or memory card. The memory system includes a controller 1522, which can be as in the embodiments described above with respect to FIG. 2, and a number of memory die 1501 and 1511-1519. The memory die 1511-1519 can be non-volatile memory circuits and store data in multi-level cell (MLC) format, single level cell (SLC) format, or a combination of these, depending on the embodiment. For example, the memory circuits of 1511-1519 may each include an SLC portion and an MLC portion, initially writing data in binary format into the SLC portion and later performing an on-chip "folding operation" to write the data into the MLC portion. The memory system 1500 can also include a fast SLC non-volatile memory die 1501 configured to allow partial page access, including a fast partial page write operations.

As illustrated above with respect to FIG. 7C, a programming operation is typically performed as a series of alternating pulse and verify operations, where the number of inter-pulse verifies varies depending on the number of data states and the program algorithm. In some embodiments for a fast SLC memory device (e.g., 1501 in FIG. 15), programming speeds can be increased by performing a single pulse, no verify write operation. When writing partial pages into the SLC fast memory, the programming pulse can be optimized to the partial plane where the partial page is written. This can also improve the accuracy of a single pulse write algorithm, since otherwise a pulse sufficient to accurately program cells near the word line driver may not be sufficient to program memory cells at the far end of the word line; and, conversely, a pulse large enough to accurately program memory cells at the far end of a word line may cause excessive wear on memory cells near the driver.

Figure 16:
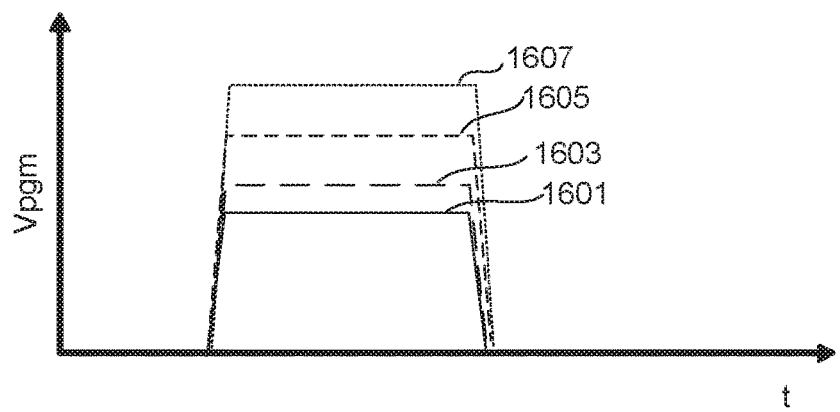
FIG. 16 illustrates some examples of programming waveforms that can be applied to a selected word line for different partial planes in a single pulse, partial page programming algorithm.

FIG. 16 illustrates some examples of programming waveforms Vpgm that can be applied to a selected word line for different partial planes in a single pulse, partial page programming algorithm. Due to the RC characteristics of the word lines, partial planes further from a word line driver will use a programming pulse of greater amplitude, longer duration, or both, to obtain the same degree of programming as a partial plane nearer to the driver. To be able to use a common timing for all of the partial planes, the embodiment illustrated with respect to FIG. 16 uses the same duration, but different amplitudes, for the program pulse of different partial planes. FIG. 16 shows four single programming pulses Vpgm for four different partial planes, where the four pulses 1601, 1603, 1605 and 1607 respectively correspond to four planes progressively further from the word line driver, such as respective partial planes 1022, 1024, 1026 and 1028 of FIG. 11.

Figure 17:
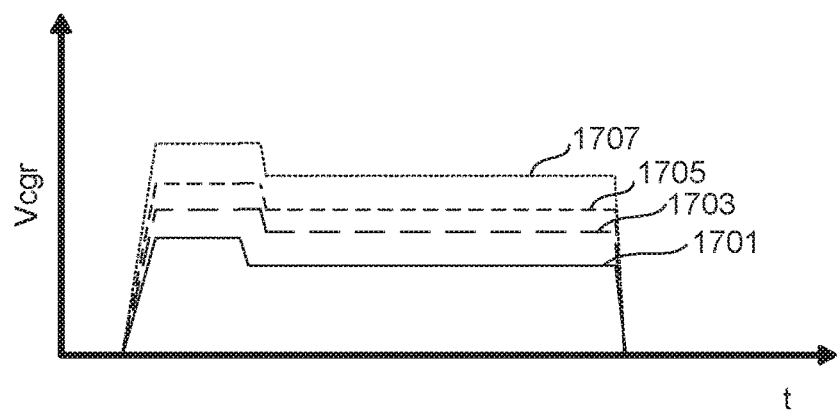
FIG. 17 illustrates some examples of reading waveforms that can be applied to a selected word line for different partial planes in a binary read algorithm.

FIG. 17 illustrates some examples of reading waveforms Vcgr that can be applied to a selected word line for different partial planes in a binary read algorithm for the fast SLC memory die 1501. Due to the RC characteristics of the word lines, partial planes further from a word line driver will use a sensing waveform of greater amplitude, longer duration, or both, to set the word line level as for a partial plane nearer to the driver. To be able to use a common timing for all of the partial planes, the embodiment illustrated with respect to FIG. 17 uses the same duration, but different amplitudes for the program pulse of different partial planes. FIG. 17 shows four sensing waveforms Vcgr for four different partial planes, where the four waveforms 1701, 1703, 1705 and 1707 respectively correspond to four planes progressively further from the word line driver, such as respective partial planes 1022, 1024, 1026 and 1028 of FIG. 11. The reading waveforms of FIG. 17 also illustrate the use of an initial kick, which can be included in some embodiments. Although the use of partial plane allows for more uniform behavior along a section of a word line being accessed, to offset residual variation within a partial plane, the Vcgr waveform can initially be raised somewhat above the desired value to pull up the word line level more quickly, before being dropped back down to the eventual Vcgr value of the partial plane. Both the duration and the incremental voltage increase of the kick can be optimized for each of the partial planes.

Figure 18:
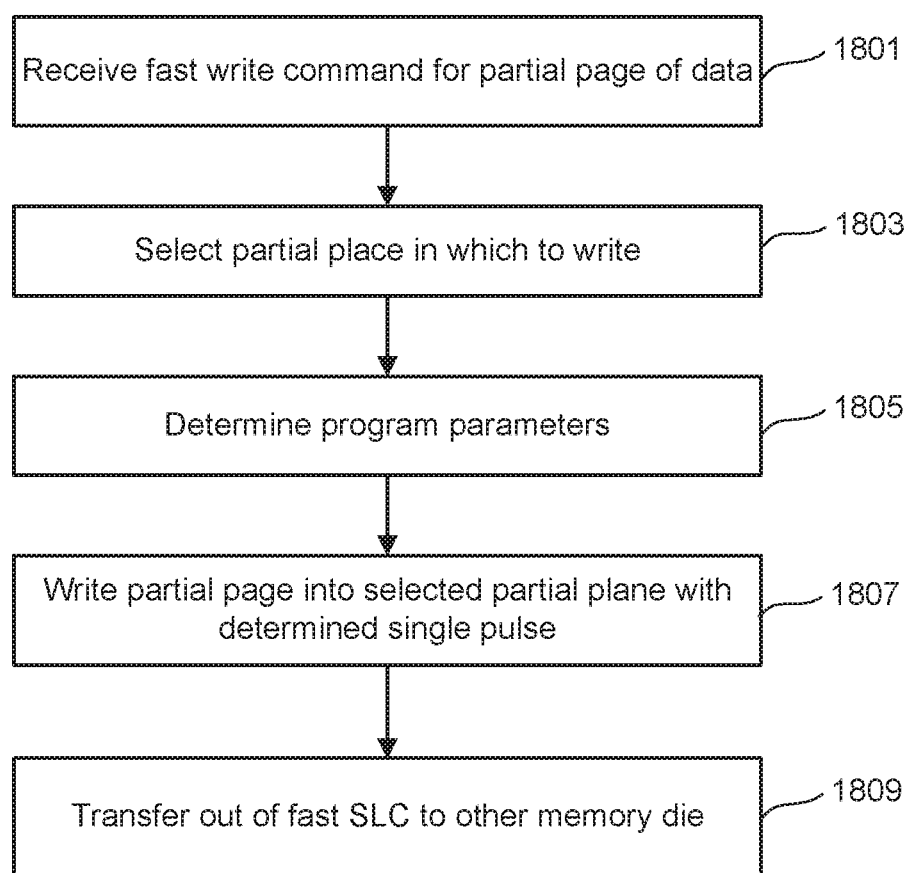
FIGS. 18 and 19 are flowcharts describing one set of embodiments of processes for accessing the fast SLC memory FIG. 15 for programming and reading using waveforms as in FIGS. 16 and 17.
Figure 19:
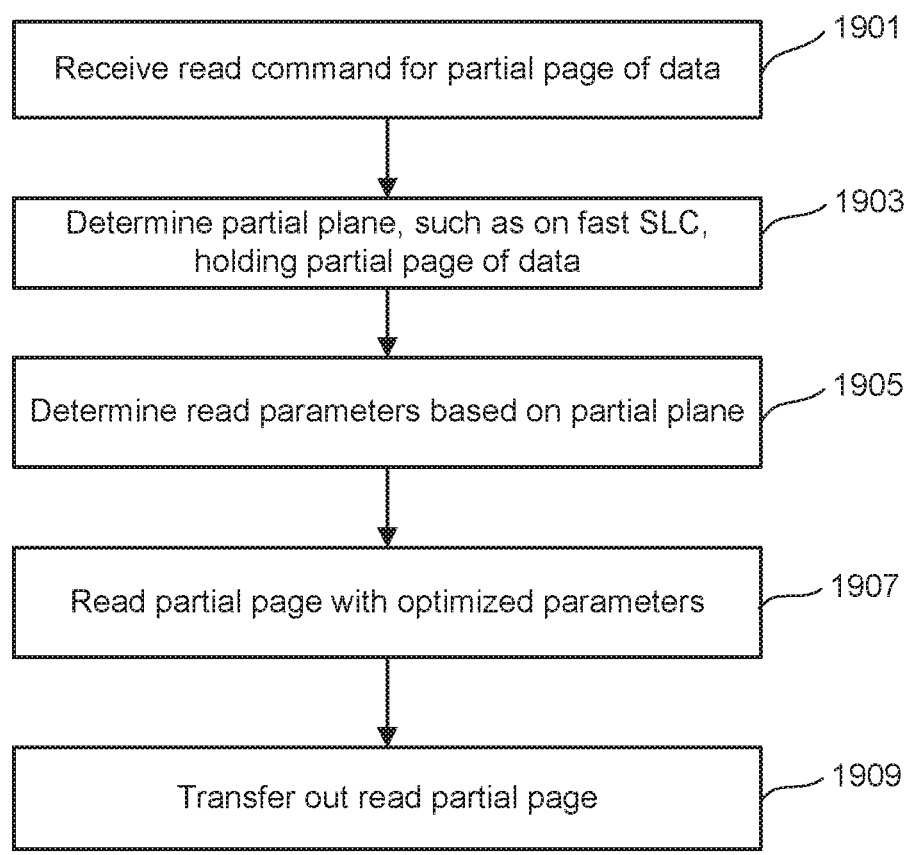

FIGS. 18 and 19 are flowcharts describing one set of embodiments of processes for accessing a fast SLC memory die 1501 of FIG. 15 for programming and reading using waveforms as in FIGS. 16 and 17. For the write process of FIG. 18, the fast SLC memory die 1501 receives a fast write command for a partial page of data at step 1801. Depending on the embodiment, the host 1540 can specify that the write command is a fast write command, this can be determined either by the controller 1522 or the on-chip control block 1050 based on it being a partial page or on usage patterns, or this can be the default write mode. At step 1803, the fast SLC memory die 1501 determines the partial plane in which to write the partial page and, at step 1805, determines the write parameters for the page. For example, step 1805 can correspond to selecting one of the wave forms of FIG. 16 based on the selected partial plane, with the partial plane programming parameters kept in, say, a look up table on the device. If the partial page of data is to be scrambled, a scrambling step can also be included at some point between steps 1801 and 1807, similarly to as described above with respect to step 1356 of FIG. 13. At step 1807, the partial is then written to the memory cells along a selected word line of the selected partial plane using the single pulse for the selected partial plane. Subsequently, the partial page can be moved into one of the other memory circuits at step 1809. Depending on the embodiment, the determination to transfer out the partial page of data can be based on time, based on usage patterns as monitored by the on-chip control block 1050 or the memory system controller 1522, as part of a regular consolidation process of partial pages, or some combination of these. For instance, partial not frequently accessed partial pages can be consolidated into whole pages and written into high density MLC memory as a background operation.

For the read process of FIG. 19, at step 1901 the memory system receives a read command for a partial page of data. The read could be in response to host request or come from the controller 1522 as part of data consolidation or other housekeeping operations. The controller 1522 determines which of the memory die 1501, 1511-1519 contains the requested data at step 1903 and directs the request accordingly. If the requested partial page is on fast SLC memory die 1501, as may be the case for a recently written or frequently accessed partial page, a read waveform such as illustrated in FIG. 17 can be used. At step 1905, the read parameters corresponding to the partial plane holding the requested data are determined, which for the fast SLC memory device can be one of the waveforms of FIG. 17 and, more generally, for the memory die 1501 and 1511-1519 that support partial page read, these can be determined based, for example, on a look up table on the device. Using the determined parameters, the partial page is read out at step 1907. If the partial page was scrambled, it is then unscrambled and transferred out to the controller and, if the read is in response to a host request, is transferred to the host at step 1909.

Figure 20:
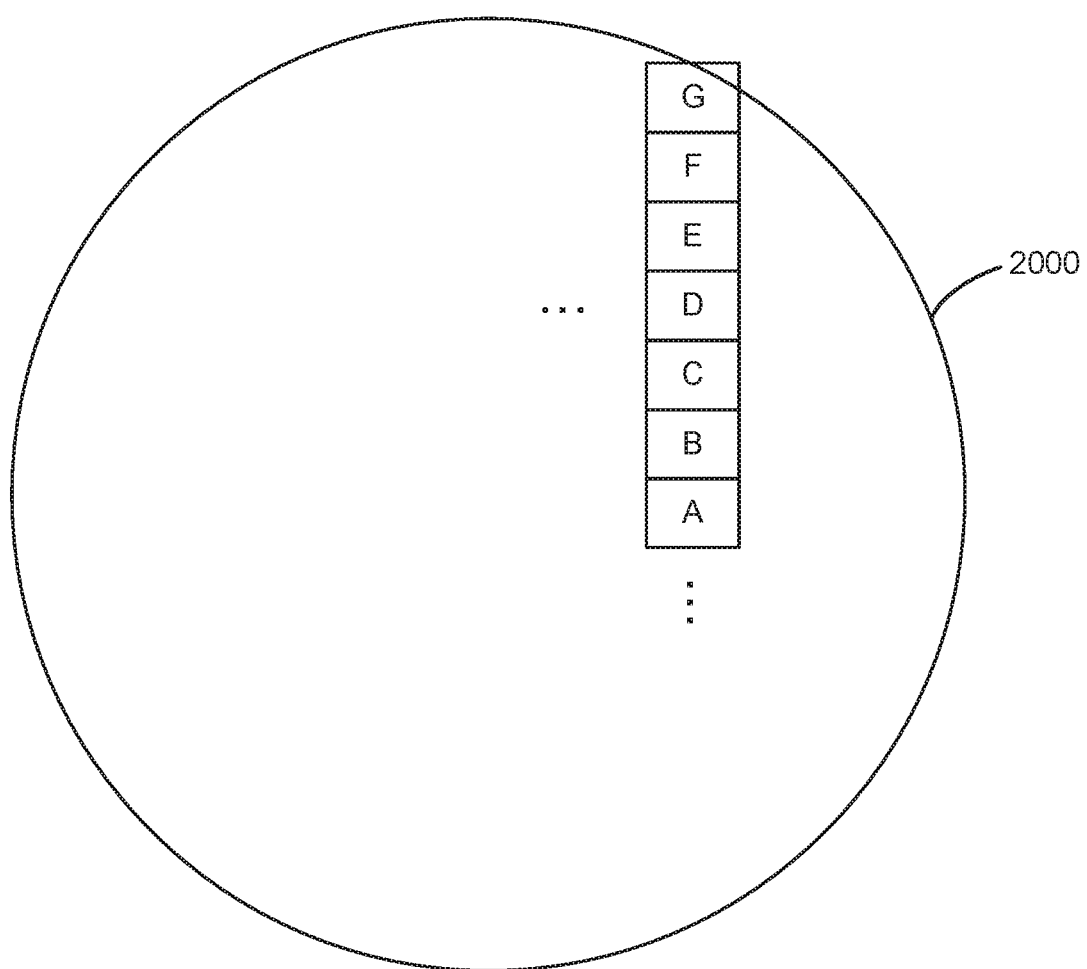
FIG. 20 depicts a semiconductor wafer.

Another embodiment where partial page operations can be used is when the memory array, or a portion of the array, is less than complete. Semiconductor memories, such as flash memory and other types of memories, are often manufactured on a semiconductor wafer (or other material). Reticles are used to print circuits (or images of circuits) on the wafer. The reticle is moved across a wafer for a plurality of shots. Because the memory die is rectangular and the wafer is round, there will be dies printed at the edges for which a portion of the die is off the edge of the wafer, thereby making the die incomplete (and referred to as a partial memory die). For example, FIG. 20 depicts a wafer 2000. A plurality of instances of a memory system are fabricated on wafer 2000. Each instance of the memory system will become a memory die. Eventually, wafer 2000 will be cut into separate dies in a process referred to as singulation. FIG. 20 shows dies A, B, C, D, E, F and G of wafer 2000. It is likely that wafer 2000 will include other dies in addition to dies A-G; however, those other dies are not depicted to make FIG. 20 easier to read. As can been seen, dies A-F are formed within the boundary of wafer 2000. However, die G is fabricated at the edge of wafer 2000 such that a portion of what should have been die G is off the edge of wafer 2000 and, therefore, missing from die G. As a result, die G is a partial memory die.

In the past, partial memory dies were discarded because they were missing components and, therefore, did not function properly. It is proposed to utilize partial memory die in order to increase manufacturing yield and reduce waste. Therefore, more memory die from a wafer can be sold, which increases the revenue derived from a manufactured semiconductor wafer.

As used herein, a partial memory die may include a non-volatile memory structure that is missing components due to a portion of that memory structure not being printed (or otherwise fabricated). There may be a variety of reasons that the portion of the memory structure is not printed or otherwise fabricated. In certain embodiments, the portion of the memory structure is not printed or otherwise fabricated because the die positioning on the wafer results in some portion of the die being positioned on the wafer and another portion of the die being positioned beyond the edge of the wafer, as discussed above with respect to die G of FIG. 20. In some embodiments, the partial memory die also includes a control circuit connected to the memory structure. The control circuit is configured to write to the memory structure and read from the memory structure, even if the memory structure is missing components.

FIG. 21 shows a partial memory die 2103, which includes an incomplete memory structure (e.g., incomplete memory array). For example, the partial memory die 2103 was removed from an edge of a wafer such that the partial memory die is missing a portion that was not printed (or otherwise fabricated) on the wafer. That is, the partial memory die is missing components MC that should be part of the memory die, but they were not printed (or otherwise fabricated) on the wafer because the die was at the edge of the wafer, as explained above with respect to die G of FIG. 20.

The incomplete memory structure of partial memory die 2103 includes two planes: plane 0 and plane 1. In other embodiments, the memory structure can include more than two planes. Plane 0 is complete, meaning it is not missing any portion or components. In the example of FIG. 21, plane 1 is incomplete, meaning that plane 1 is missing a portion of the plane that is supposed to be there. FIG. 21 shows that plane 1 is missing components MC that were not printed (or otherwise fabricated) on the die because the die was at the edge of the wafer. Partially printed or fabricated die may be formed because it may be more cost effective to continue the fabrication process even though certain die may extend beyond that wafer boundary rather than not fabricating the partial memory die. Plane 1 is missing components MC corresponding to components found in plane 0. The missing components MC can include portions of the substrate, memory cells, entire NAND strings, portions or entire bit lines, portions or entire word lines, portions or entire select lines and dielectric regions. In some embodiments, plane 1 (or the incomplete memory array) comprises a plurality of erase blocks. Some of the erase blocks are complete erase blocks, meaning that they are not missing any components. Some of the erase blocks are incomplete erase blocks, meaning that they are missing components. The erase blocks missing components are physically partial memory blocks because they are missing silicon components corresponding to silicon components found in complete erase blocks. For example, the physically partial memory blocks (incomplete erase blocks) are missing non-volatile memory cells, bit lines, portions of bit lines, word lines, portions of word line and portions of substrate corresponding to respective memory cells, bit lines, portions of bit lines, word lines, portions of word line and portions of substrate found in complete erase blocks. The control circuits discussed herein are capable of successfully programming and reading the physically partial memory blocks, as described below.

Plane 0 and plane 1 have the same (i.e. common) address space size. For example, both planes may have intended to be storage for X gigabytes of data and have an address space big enough to address X gigabytes. Even though plane 1 is incomplete, it still has the same address space size, even if it cannot use some of the address space due to missing memory cells.

Partial memory die 2103 also includes Support Circuits 2104, which are connected to plane 0 and plane 1. Support Circuits 2104 can include one or more circuits that may be referred to as a control circuit for successfully performing memory operations. An example of Support Circuits 2104 includes control circuitry 110, read/write circuits 128, decoders 124, and decoders 132 of FIG. 1A. Other circuits can also be part of Support Circuits 2104. Although FIG. 21 shows Support Circuits 2104 below Plane 0 and Plane 1, in other embodiments the Support Circuits 2104 can be in other positions (e.g., above, adjacent or between Plane 0 and Plane 1). Support Circuits 2104 can also be divided into different sections, with each section located at different positions in the memory die. Additionally, plane 0 and plane 1 can be positioned differently, including layouts where the planes are not adjacent to each other.

Partial memory die 2103 is depicted with right handed curvature, as the curve representing the edge of the wafer is on the right-hand side of partial memory die 2103. In another embodiment, the partial memory die may have left handed curvature, as the curve representing the edge of the wafer is on the left-hand side of the partial memory die; therefore, the incomplete memory structure of such a partial memory die 2103 includes plane 0 and plane 1, with plane 0 being incomplete and plane 1 being complete. In another embodiment, the partial memory die may have top curvature, as the curve representing the edge of the wafer is on the top side of the partial memory die; therefore, the incomplete memory structure of such a partial memory die 2103 includes plane 0 and plane 1, with both plane 0 and plane 1 being incomplete planes.

The technology described herein for writing to and reading from partial planes can be used on partial memory dies. Thus, any of the planes discussed above (e.g., planes 141, 142, 1020) can be incomplete planes. For example, when the plane is divided into partial planes, those partial planes that are missing components because they were not fabricated or are otherwise unavailable will not be used. Instead, the memory system will perform partial page programming/writing and partial page reading for partial planes that are properly fabricated on the memory die.

As used herein, an incomplete partial plane is a partial plane that is missing components that it was designed to have. In certain embodiments, an incomplete partial plane is fabricated due to a fabrication side effect. As described herein, there are a variety of potential fabrication side effects. One example of a fabrication side effect may be, that the partial memory die was positioned near an edge of a wafer such that the incomplete partial plane of the partial memory die is missing a portion that was not printed (or otherwise fabricated) on the wafer. That is, the incomplete partial plane of the partial memory die is missing components (e.g., memory cells, bit lines, substrate, etc.) that should be part of the partial plane but they were not printed on the wafer because the die was positioned near the edge of the wafer, as explained above with respect to die G of FIG. 20. Another possible fabrication side effect may be misalignment of a wafer dicing machine such that parts of a die are cut during a dicing operation. A complete partial plane has all of the components it was designed to have.

According to a first set of aspects, an apparatus includes a word line, a plurality of non-volatile memory cells connected along the word line, and a word line driver configured to bias the word line. The apparatus further includes a control circuit connected to the word line driver and configured to perform a memory operation on a selected subset the of memory cells by biasing the word line based on a location of the selected subset of memory cells along the word line.

In other aspects, an apparatus includes an array of non-volatile memory cells and one or more control circuits connected to the array of non-volatile memory cells. The array includes a plurality of partial planes, each of the partial planes corresponding to a non-overlapping subset of the memory cells connected along a word line. The one or more control circuits are configured to read data from and write data to a selected one of the partial planes by applying one or more voltages to the word line that are dependent on a resistive/capacitive behavior of the word line in the partial plane.

In still further aspects, a non-volatile memory device includes a memory structure comprising a plane of non-volatile memory cells, the plane divided into a plurality of partial planes. Means are connected to the memory structure for writing to and reading from the memory cells by writing a partial page into a particular partial plane and reading the partial page from the particular partial plane using a set of parameters optimized for the particular partial plane.

Embodiments for the memory structure can include memory arrays such as those describe above with respect to array 126 of FIGS. 1A, 1B, 3A, 3B and 4. The memory cells can have a charge storage regions and be part of a NAND type array having a 3D structure; use a phase change memory (PCM) material in a three-dimensional memory array with a vertical cross-point structure; or use other non-volatile memory technology. The means for writing to and reading from the memory cells can include the row decoding and word line drivers, such as elements 124 in FIG. 1A and 1011 in FIG. 11; the column decoding and read/write circuits, such elements 128 and 132 of FIG. 1A and 1021, 1023, 1025, 1027, 1029 and 1031 of FIG. 11; and the on-die control circuits 110 of FIG. 1 and control block 1050 of FIG. 11, the controller 122 of FIGS. 1A and 2 and 1522 of FIG. 15, or various combinations of these.

Other aspects include a method that includes receiving a command to access a partial page of data in a contiguous subset of memory cells connected to a word line; determining a voltage to apply to the word line based on a location of the contiguous subset of memory cells along the word line relative to a word line driver; and accessing the partial page of data, the accessing including applying the determined voltage to the word line.

Yet more aspects include a system that includes a non-volatile memory controller and a memory die. The memory die includes: an array of non-volatile memory cells; and an on-die control circuit connected to the array of non-volatile memory cells. The on-die control circuit is configured to read and write data as a full page, where a full page corresponding to a plurality of memory cells connected along a word line, and is configured to read and write data as one of a plurality of partial pages, each of the partial pages corresponding to a contiguous subset of the plurality of memory cells connected to the word line. One or more voltages applied to the word line in a read or write operation of a selected partial page are based on a capacitive behavior of a portion of word line along which the memory cells of the selected partial page are connected.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a word line;
a plurality of non-volatile memory cells connected along the word line;
a word line driver configured to bias the word line; and
a control circuit connected to the word line driver and configured to perform a memory operation on a selected subset the of memory cells by biasing the word line based on a location of the selected subset of memory cells along the word line.

2. The apparatus of claim 1,
a plurality of bit lines, each of the memory cells connected to a corresponding one of the bit lines; and
a decoding circuit connected to the bit lines and configured to select the selected subset of memory cells from a plurality of non-interleaved subsets of the memory cells.

3. The apparatus of claim 2, wherein each of the non-interleaved subsets of the memory cells includes one or more redundant memory cells.

4. The apparatus of claim 1 wherein:
the word line driver is configured to bias the word line by applying one of a plurality of program voltage pulse levels, wherein an amplitude of a voltage pulse applied to the word line when writing data to a selected subset of the memory cells is dependent on the location on the selected subset of memory cells along the word line.

5. The apparatus of claim 4, wherein the control circuit is configured to store data in the memory cells in a binary format and write data to the selected subset of memory cells by applying a single voltage pulse to the word line.

6. The apparatus of claim 4, wherein the word line driver is configured to apply a program voltage pulse having a larger amplitude for a subset of the memory cells further from the word line driver than for a subset of the memory cells nearer the word line driver.

7. The apparatus of claim 1, wherein:
the word line driver is configured to bias the word line by applying one of a plurality of sensing waveforms to the word line, wherein an amplitude of a sensing waveform applied to the word line when reading data from the selected subset of the memory cells is dependent on the location on the selected subset of memory cells along the word line.

8. The apparatus of claim 7, wherein the word line driver is configured to apply a sensing waveform having a larger amplitude for a subset of the memory cells further from the word line driver than for a subset of the memory cells nearer the word line driver.

9. The apparatus of claim 1, wherein:
the control circuit is configured to receive a partial page of data, break the partial page of data into a plurality of chunks of data, scramble the chunks of data, and write the scrambled plurality of chunks of data to the selected subset of the memory cells.

10. The apparatus of claim 1, wherein the memory cells comprise a memory array of a monolithic three-dimensional semiconductor memory device in which the memory cells are arranged in multiple physical levels above a silicon substrate and comprise a charge storage medium.

11. The apparatus of claim 1, each of the memory cells comprising a phase change memory material.

12. The apparatus of claim 4, wherein the selected subset of memory cells is one of a plurality of contiguous non-overlapping subsets of the memory cells connected along the word line.

13. The apparatus of claim 12, wherein the apparatus further comprises:
   a plurality of bit lines, each of the memory cells connects along a corresponding one of the bit lines, and
   wherein the control circuit is connected to the bit lines and is further configured to bias bit lines corresponding to the memory cells of the selected subset to a program enable voltage and bias bit lines corresponding to the memory cells of subsets other than the selected subset to a program inhibit voltage when writing data to the selected subset of the memory cells.

14. The apparatus of claim 13, wherein the control circuit is configured to store data in the memory cells in a binary format and write data to the selected subset of memory cells by applying a single voltage pulse to the word line.

15. The apparatus of claim 14, wherein the control circuit is further configured to:
   subsequent to writing data to the selected subset of memory cells, write data to a second subset of memory cells by applying a single voltage pulse to the word line while biasing the bit lines corresponding to the memory cells of the selected subset to the program inhibit voltage and biasing bit lines corresponding to the memory cells of the second subset to a program enable voltage.

16. The apparatus of claim 4, wherein the control circuit is configured to store data in the memory cells in a multi-level cell format and write data to the selected subset of memory cells by applying a sequence of voltage pulses to the word line.

17. The apparatus of claim 16, wherein an amplitude of an initial voltage pulse of the sequence of voltage pulses applied to the word line when writing data to a selected subset of the memory cells is dependent on the location on the selected subset of memory cells along the word line.

18. The apparatus of claim 4, wherein the control circuit is further configured to bias the word line by applying one of a plurality of sensing waveforms to the word line, wherein an amplitude of a sensing waveform applied to the word line when reading data from the selected subset of the memory cells is dependent on the location on the selected subset of memory cells along the word line.

19. The apparatus of claim 1, wherein:
   the word line driver is configured to bias the word line by applying one of a plurality of program voltage pulse levels, wherein a duration of a voltage pulse applied to the word line when writing data to a selected subset of the memory cells is dependent on the location on the selected subset of memory cells along the word line.

20. The apparatus of claim 19, wherein the control circuit is configured to store data in the memory cells in a binary format and write data to the selected subset of memory cells by applying a single voltage pulse to the word line.

* * * * *